United States Patent
Abe et al.

(10) Patent No.: US 6,313,676 B1
(45) Date of Patent: Nov. 6, 2001

(54) SYNCHRONOUS TYPE SEMICONDUCTOR INTEGRATED CIRCUIT HAVING A DELAY MONITOR CONTROLLED BY A DELAY CONTROL SIGNAL OBTAINED IN A DELAY MEASURING MODE

(75) Inventors: Katsumi Abe; Masahiro Kamoshida; Shigeo Ohshima, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,561

(22) Filed: Mar. 16, 2000

(30) Foreign Application Priority Data

Mar. 16, 1999 (JP) .................................. 11-069912

(51) Int. Cl.$^7$ ...................................................... H03L 7/06
(52) U.S. Cl. ............................ 327/158; 327/159; 375/375
(58) Field of Search .................................... 327/158, 159, 327/161–163; 375/362, 373, 375, 376

(56) References Cited

U.S. PATENT DOCUMENTS

| | | |
|---|---|---|
| 5,717,353 | 2/1998 | Fujimoto . |
| 6,100,736 * | 10/2000 | Wu et al. .............................. 327/159 |
| 6,127,895 * | 10/2000 | Tailor .................................... 327/159 |

OTHER PUBLICATIONS

Okajima, Y., et al., "Paper *Special Issue on ULSI Memory Technology*: Digital Delay Locked Loop and Design Technique for High–Speed Synchronous Interface", IEICE Trans. Electron., vol. E79–C, No. 6, pp. 798–807 (1996).

Saeki, T., et al., "A Direct–Skew–Detect Synchronous Mirror Delay for Application–Specific Integrated Circuits", *IEEE Journal of Solid–State Circuits*, vol. 34, No. 3, pp. 372–379, (1999).

* cited by examiner

*Primary Examiner*—Kenneth B. Wells
(74) *Attorney, Agent, or Firm*—Finnegan, Henderson, Farabow, Garrett & Dunner, L.L.P.

(57) ABSTRACT

A semiconductor integrated circuit has an internal clock signal generator circuit and a data input/output circuit. The internal clock signal generator circuit includes a clock receiver, a synchronous delay control circuit, a clock driver, an output control circuit, a delay monitor, and a control signal generator circuit. Accordingly, in a delay measuring mode, a delay in the input signal is set in the delay monitor based on a measurement start signal and a measurement stop signal. After completion of the delay measuring mode, the delay monitor causes the signal CLK, outputted from the clock receiver, to lag behind by a delay set in the delay measuring mode. Further, the delay monitor outputs the delayed signal to the synchronous delay control circuit.

14 Claims, 23 Drawing Sheets

SYNCHRONOUS TYPE SEMICONDUCTOR INTEGRATED CIRCUIT HAVING A DELAY MONITOR CONTROLLED BY A DELAY CONTROL SIGNAL OBTAINED IN A DELAY MEASURING MODE

CROSS-REFERENCE TO RELATED APPLICATIONS

This application is based upon and claims the benefit of priority from the Japanese Patent Application No. 11-069912, filed Mar. 16, 1999, the entire contents of which are incorporated herein by reference.

BACKGROUND OF THE INVENTION

This invention relates to a synchronous semiconductor integrated circuit which generates an internal clock signal synchronizing with an external clock signal and performs input/output control of data in synchronization with the internal clock signal, and more particularly to a synchronous semiconductor integrated circuit used in, for example, a synchronous DRAM or a RAMBUS DRAM which generates an internal clock according to the load characteristic of an external data bus onto which data is outputted.

As the operating speed of a semiconductor integrated circuit is made higher, this gives rise to a problem: even a slight delay between the internal clock signal driving the internal circuit and the external clock signal causes the circuit to operate erroneously.

Such a problem can be solved by incorporating a clocked delay control circuit into a semiconductor integrated circuit.

The clocked delay control circuit synchronizes with an external clock signal and generates a delay signal delayed for n (n is an integer) periods of the external clock signal. This signal is used as an internal clock signal.

Hereinafter, the clocked delay control circuit will be explained briefly.

Clocked delay control circuits are available in two types: those of the SAD type using a synchronous adjustable delay (hereinafter, referred to as SAD) and those of the DLL type using a delay locked loop (hereinafter, referred to as DLL). Clocked delay control circuits of both types use delay lines to synchronize the internal clock signal with the external clock signal.

The SAD type of clocked delay control circuit generates a signal caused to lag behind the external clock signal by an integral multiple of the period without using a feedback loop and uses this signal as an internal clock signal. The PLL type of clocked delay control circuit compares the phase of the internal clock signal with that of the external clock signal using a feedback loop and controls the delay lines according to the phase difference, thereby generating an internal clock signal synchronizing with the external clock.

FIG. 1 is a block diagram of a conventional clocked delay control circuit of the SAD type. The clocked delay control circuit includes of a clock receiver 11 to which an external clock signal ExtCLK is inputted, a delay monitor 12 for delaying the output of the clock receiver 11, a forward pulse delay line 14 which is composed of unit delay circuits 13 and delays the output signal FCL of the delay monitor 12 by causing the unit delay circuits 13 to propagate the output signal FCL as a forward pulse in sequence, a control circuit 15 to which the output signal CLK of the clock receiver 11 is supplied, a backward pulse delay line 16 which is composed of unit delay circuits 13 and delays the backward pulse transferred from the forward pulse delay line 14 by causing the unit delay circuits 13 to propagate the backward pulse sequentially, and an output buffer 17 to which the output signal RCL from the backward pulse delay line 16 is inputted and outputs an internal clock signal IntCLK.

The operating principle of the clocked delay control circuit will be explained by reference to timing charts in FIGS. 2A to 2E.

As shown in FIGS. 2A to 2E, the external clock signal ExtCLK with a period of T is amplified and waveform-shaped by the clock receiver 11 and becomes a signal CLK delayed for a delay time of tRC in the clock receiver 11. The signal CLK is inputted to the control circuit 15 and simultaneously to the delay monitor 12. The delay monitor 12 has a delay time of tDM (tDM=tRC+tDR) equal to the sum of the delay time tRC in the clock receiver 11 and the delay time tDR in the output buffer 17. The signal delayed by the delay monitor 12 is inputted as a signal FCL to the forward pulse delay line 14.

The control circuit 15 has the function of, when the signal CLK is at the high level, stopping the propagation of the forward pulse on the forward pulse delay line 14 and transferring the signal to the backward pulse delay line 16. Thus, the signal FCL is propagated and delayed as a forward pulse over the forward pulse delay line 14 during a period of (T−tDM) until the signal CLK has risen. Thereafter, the signal FCL is transferred to the backward pulse delay line 16 (this time is represented by t in FIGS. 2A to 2E).

The signal transferred to the backward pulse delay line 16 is propagated and delayed as a backward pulse over as many unit delay circuits 13 in the backward pulse delay line 16 as the forward pulse has in the forward pulse delay line 14. Then, the backward pulse delay line 16 outputs the signal as a signal RCL delayed a period of (T−tDM) from time t. The signal RCL is further delayed for the delay time tDR at the output buffer 17 and outputted as an internal clock signal IntCLK.

A delay time of ∆TOTAL on the internal clock signal IntCLK with respect to the external clock signal ExtCLK is given as follows:

$$\Delta TOTAL = tRC + tDM + 2(T - tDM) + tDR \tag{1}$$

Since tRC+tDR=tDM, equation (1) is simplified as follows:

$$\begin{aligned} \Delta TOTAL &= (tRC + rDR) + tDM + 2T - 2tDM \\ &= tDM + tDM + 2T - 2tDM \\ &= 2T \end{aligned} \tag{2}$$

Thus, the internal clock signal starts to synchronize with the external clock signal at the third period of the external clock signal.

FIG. 3 is a block diagram of a conventional clocked delay control circuit of the DLL type.

The DLL clocked delay control circuit includes a clock receiver 11, a delay line 14A, an output buffer 17, a control circuit 15A composed of a shift register, a delay monitor 12A, and a phase comparator 18.

The operating principle of the DLL clocked delay control circuit will be explained by reference to timing charts in FIGS. 4A to 4E.

As shown in FIGS. 4A to 4E, the external clock signal ExtCLK with a period of T is amplified and waveform-shaped by the clock receiver 11. The resulting signal is then outputted as a signal CLKA delayed for the delay time tRC in the clock receiver 11. The signal CLKA is inputted to the delay line 14A and phase comparator 18.

As shown in FIG. 3, the delay line 14A is composed of n unit delay circuits 13 connected in a multistage manner. The signal CLKA is inputted to the unit delay circuit 13k at the k-th stage ($1 \leq k \leq n$). Then, the unit delay circuit 13n at the n-th stage, the last stage, outputs the signal as a signal CLKAd.

The signal CLKAd is inputted to the delay monitor 12A. The delay monitor 12A has a delay time of tDM (tDM= tRC+tDR) equal to the sum of the delay time tRC in the clock receiver 11 and the delay time tDR in the output buffer 17. The signal delayed by the delay monitor 12A is inputted as a signal CLKB to the phase comparator 18, which compares the phase of the signal CLKB with that of the previous signal CLKA. The result of the comparison is inputted to the control circuit 15A. According to the result of the comparison, the control circuit 15A changes the position of the stage of the unit delay circuit 13 to which the signal CLKA is inputted.

The signal CLKAd is further delayed by the output buffer 17 for its delay time tDR. The delayed signal is outputted as an internal clock signal IntCLK.

If the delay time occurring on the delay line 14A with respect to the signal CLKA is t(k), a delay time of ΔTOTAL on the internal clock signal IntCLK with respect to the external clock signal ExtCLK is given by the following equation:

$$\Delta TOTAL = tRC + t(k) + tDR \quad (3)$$

The phase difference ΔAB between signal CLKA and signal CLKB is:

$$\Delta AB = t(k) + tDM \quad (4)$$

When k is so determined that the phase of signal CLKA is equal to that of signal CLKB (ΔAB=T), it follows from equations (3) and (4) and the equation tDM=tRC+tDR that the delay time of the internal clock signal IntCLK from the external clock signal ExtCLK is T. This means that the internal clock signal IntCLK synchronizes with the external clock signal ExtCLK.

In the circuit of FIG. 3, the principle of putting signal CLKA in phase with signal CLKB will be explained. It is assumed that signal CLKA is inputted to the unit delay circuit 13k at the k-th stage of the delay line 14A and signal CLKB lags in phase behind signal CLKA. At this time, to shorten the length of the delay line along which signal CLKA propagates (or decrease the number of unit delay circuits), that is, to make the value of k larger to make t(k) smaller, a right shift signal is supplied from the phase comparator 18 to the control circuit 15A. Conversely, when signal CLKB leads signal CLKA in phase, a left shift signal is supplied from the phase comparator 18 to the control circuit 15A to lengthen the delay line along which signal CLKA propagates. Repeating such processes enables signal CLKA to be put in phase with signal CLKB.

While in the circuit of FIG. 3, the delay line 14A and control circuit 15A are composed of such digital circuits as logic circuits and shift registers, they may be constructed by using an analog circuit as shown in FIG. 5 to improve the accuracy of clock synchronization.

A conventional clocked delay control circuit shown in FIG. 5 uses a voltage controlled delay line (hereinafter, referred to as VCD) 14B as the delay line and a charge pump circuit 19 and a loop filter circuit 15B in place of the previous control circuit 15A.

Since the operating principle of the circuit is the same as that of the DLL clocked delay control circuit with a digital circuit configuration of FIG. 3, a detailed explanation of it will not be given and only what differs from FIG. 3 will be described.

A delay line VCD 14B is composed of unit delay elements. Unlike the circuit of FIG. 3 where the number of unit delay elements in the delay line over which signal CLKA propagates is changed according to the output of the control circuit 15A, the circuit of FIG. 5 is such that the delay time per stage of unit delay element is varied according to the output of the loop filter circuit 15B, thereby adjusting the propagation delay time tVCDL on the entire delay line 14B, which synchronizes the internal clock signal IntCLK with the external clock signal ExtCLK.

The charge pump circuit 19 used has the function of generating an analog voltage corresponding to the output signal of the phase comparator 18. The loop filter circuit 15B has the function of enabling a stable operation without the oscillation of the analog feedback loop.

As described above, any type of clocked delay control circuit uses a delay monitor. To increase the accuracy of the synchronization of the internal clock signal with the external clock signal, the delay time tDM in the delay monitor has to be made exactly equal to the sum of the delay time tRC in the receiver and the delay time tDR in the output buffer. Namely, the accuracy of the delay monitor has a large effect on the final accuracy of the synchronization of the clocked delay control circuit.

FIG. 6 is a block diagram of an internal clock signal generator circuit using a conventional SAD clocked delay control circuit and a data input/output circuit that inputs and outputs data in synchronization with the internal clock signal generated at the internal clock signal generator circuit.

The internal clock signal generator circuit 10 includes a clock receiver 11, a synchronous delay control circuit 15C composed of, for example, the forward pulse delay line 14, control circuit 15, and backward pulse delay line 16 of FIG. 1, a clock driver 16A, an output control circuit 16B, and a delay monitor 12B. The data input/output circuit 20 includes a data input/output amplifier 21, an output buffer 22, an output driver 23, and a data receiver 24.

Numeral 30 indicates an equivalent circuit equivalently representing a controller and an external terminal system connected to an external data bus. The equivalent circuit 30 is composed of a terminal resistance 31 and a load capacitance 32.

With such a configuration, the delay monitor 12B is designed to have a delay almost equal to the sum of the input delay time and output delay time in the internal clock signal generator circuit 10. Specifically, the delay monitor 12B is composed of, for example, multiple stages of inverters 35 connected in series as shown in FIG. 7. The output signal CLK from the clock receiver 11 is inputted to the first stage of the inverters 35 connected in series. The output signal of the inverter 35 at the last stage is inputted as signal FCL to the synchronous delay control circuit 15C.

The delay monitor 12B of FIG. 7 further includes auxiliary inverters 36. Fine adjustment of the delay can be made by connecting the auxiliary inverters 36 in parallel with the inverters 35. To make the auxiliary inverters 36 enable, the parts previously grounded are disconnected from the ground.

The sum of the input delay time and output delay time in the clocked delay control circuit is not always constant and varies greatly, depending on the processing condition in the manufacture, the temperature in the environment where the device is used, the supply voltage used, the load conditions for the external data bus (including the terminal resistance 31 and load capacitance 32) and the like.

As a result, even with the conventional delay adjusting method using the inverter chain as shown in FIG. 7, the delay required by the delay monitor 12B cannot be replicated exactly.

FIG. 8 is a block diagram of a conventional SAD internal clock signal generator circuit 10 for adjusting the delay in a delay monitor by another method and a data input/output circuit 20 for inputting and outputting data in synchronization with the internal clock signal generated at the circuit 10.

To increase the accuracy of the delay in the delay monitor 12B, the delay monitor 12B includes a receiver 12B-1 having almost the same delay as that of the clock receiver 11, a driver 12B-2 having almost the same delay as that of the clock driver 16A, an output control circuit 12B-3 having the same delay as that of the output control circuit 16B, a buffer 12B-4 having almost the same delay as that of the output buffer 22, and a driver 12B-5 having almost the same delay as that of the output driver 23, which are connected in series to construct the delay monitor 12B as a pseudo data input/output route circuit. A capacitance 12B-6 having the value equivalent to the load capacitance 32 of the external data bus 30 is connected to the output of the driver 12B-5.

In the circuit of FIG. 8, however, to cause the delay monitor 12B to replicate the signal delay on the route from the input node to data output node of the external clock signal, circuits each having equivalent circuit configurations to those of all the circuits present on the route must be provided in the delay monitor 12B. Consequently, the circuit area is very large.

The fixed capacitance 12B-6 cannot replicate the external data bus exactly and, when the external load condition has changed, surely contributes to the occurrence of errors.

As described above, the delay monitor used in the conventional clocked delay control circuit has a fixed delay and therefore cannot deal with the variously changing delay time in the input route circuit and that in the output route circuit. Thus, it is very difficult for the delay monitor to set the actual delay time exactly.

When a delay monitor is composed of a pseudo data input/output route circuit to improve the accuracy of synchronization, the circuit area increases. In addition, because the delay is fixed, exact monitoring is impossible. Thus, this contributes to a serious drops in the accuracy of the synchronization of the internal clock signal with the external clock signal in the clocked delay control circuit.

Another problem encountered when a delay monitor is composed of a pseudo data input/output circuit is the current consumption in the circuits. A current-mirror circuit is used in a receiver whose circuit configuration is equivalent to the clock receiver provided as a pseudo data input/output route circuit. Since in the current-mirror circuit, a pass-through current is constantly flowing, this increases the drawn current in a low-power-consumption mode, such as a power-down mode.

Furthermore, because the delay monitor operates each time the data is accessed, the huge-sized transistors provided in the output driver or the like are driven every cycle, which is disadvantageous from the viewpoint of drawn current.

BRIEF SUMMARY OF THE INVENTION

It is, accordingly, an object of the present invention is to provide a semiconductor integrated circuit which not only suppresses the increase of the circuit area as much as possible and prevents the current consumption from increasing but also generates an internal clock signal constantly synchronizing with an external clock signal exactly even when manufacturing process conditions, temperature, supply voltage, and the environment for the external data bus have changed, and therefore can always output the data synchronizing with the external clock signal with high accuracy.

According to an aspect of the present invention, there is provided a semiconductor integrated circuit comprising: an internal clock generator circuit which has a delay monitor for delaying an external clock signal and having a delay varying according to a control signal, and generates not only an internal clock signal synchronizing with the external clock signal but also a delay-measuring internal clock signal in a delay measuring mode; a data output circuit for outputting data onto an external data bus in synchronization with the internal clock signal generated at the internal clock generator circuit; a data input circuit for taking in the data outputted onto the external data bus; and a control signal generator circuit which generates a first control signal corresponding to a first point in time that the delay-measuring internal clock signal is generated at the internal clock generator circuit in the delay measuring mode and a second control signal corresponding to a second point in time that the data output circuit outputs the data onto the external data bus in synchronization with the generated internal clock signal, and then the data input circuit takes in the data and thereafter outputs the data, and which supplies the generated first and second control signals as the control signal to the delay monitor.

According to another aspect of the present invention, there is provided a semiconductor integrated circuit comprising: an internal clock generator circuit which includes a clock input circuit for receiving an external clock signal and a delay monitor for delaying the output from the clock input circuit and having a delay varying according to a control signal, and generates an internal clock signal synchronizing with the external clock signal and a delay-measuring internal clock signal in a delay measuring mode; a data output circuit for outputting data onto an external data bus in synchronization with the internal clock signal generated at the internal clock generator circuit; a data input circuit which has a circuit configuration equivalent to that of the clock input circuit and takes in the data outputted onto the external data bus; and a control signal generator circuit which generates a first control signal corresponding to a first point in time that the delay-measuring internal clock signal is generated at the internal clock generator circuit in the delay measuring mode and a second control signal corresponding to a second point in time that the data output circuit outputs the data onto the external data bus in synchronization with the generated internal clock signal, and then the data input circuit takes in the data and thereafter outputs the data, and which supplies the generated first and second control signals as the control signal to the delay monitor.

With these configurations, because the actual signal delay time in each circuit or the delay time in outputting data according to the load state of the external data bus can be set in the delay monitor by causing the semiconductor integrated circuit to operate in the delay measuring mode with the integrated circuit mounted on a system such as a module, it is possible to cope with the variously changing delay time in the input route circuit and that in the output route circuit and therefore set the actual delay time in the delay monitor exactly.

DETAILED DESCRIPTION OF THE INVENTION

Hereinafter, referring to the accompanying drawings, embodiments of the present invention will be explained in detail.

(First Embodiment)

Figure 9:
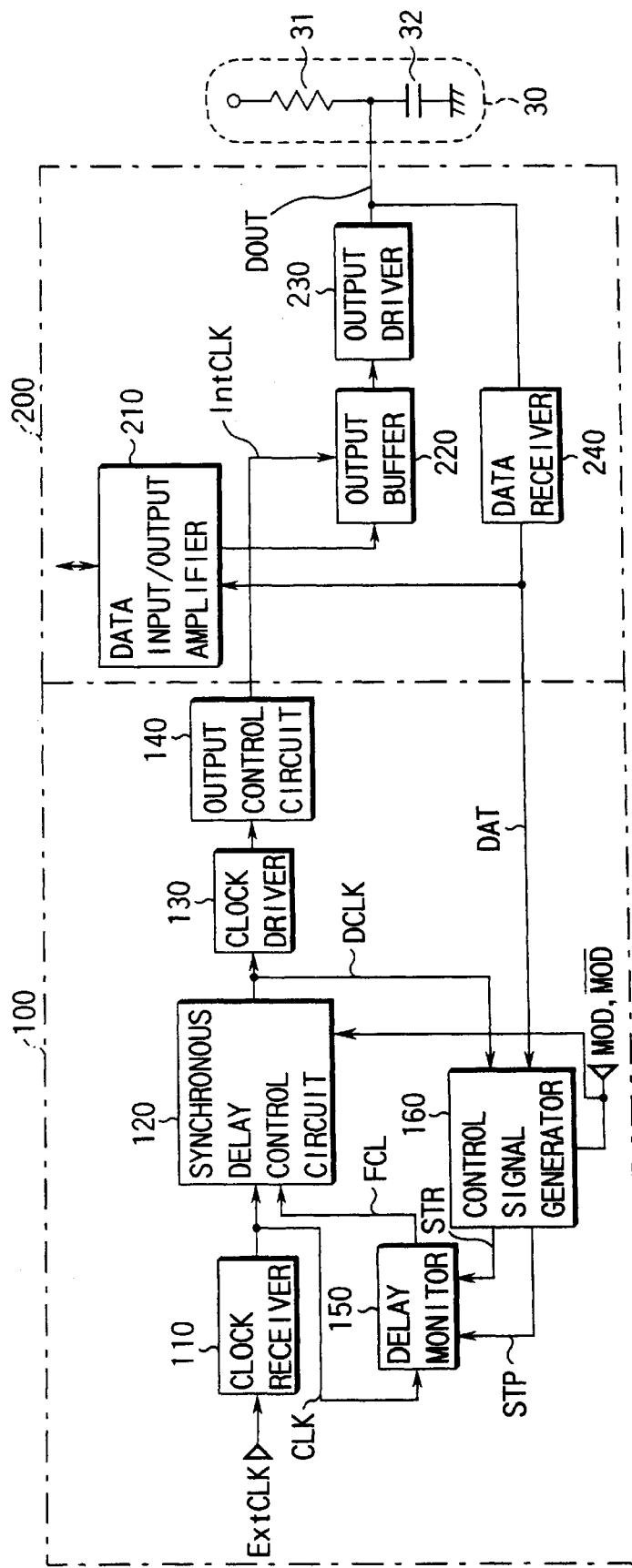
FIG. 9 is a block diagram showing the circuit configuration of a semiconductor integrated circuit according to a first embodiment of the present invention.

FIG. 9 is a block diagram showing the circuit configuration of a semiconductor integrated circuit according to a first embodiment of the present invention.

The semiconductor integrated circuit of the first embodiment comprises an internal clock signal generator circuit 100 including a SAD clocked delay control circuit and a data input/output circuit 200 for inputting and outputting data in synchronization with the internal clock signal generated at the internal clock signal generator circuit 100.

The internal clock signal generator circuit 100 includes a clock receiver 110, a synchronous delay control circuit 120, a clock driver 130, an output control circuit 140, a delay monitor 150, and a control signal generator circuit 160.

An external clock signal ExtCLK is inputted to the clock receiver 110, which outputs a signal CLK. The signal CLK is inputted to not only the synchronous delay control circuit 120 but also the delay monitor 150.

Figure 12:
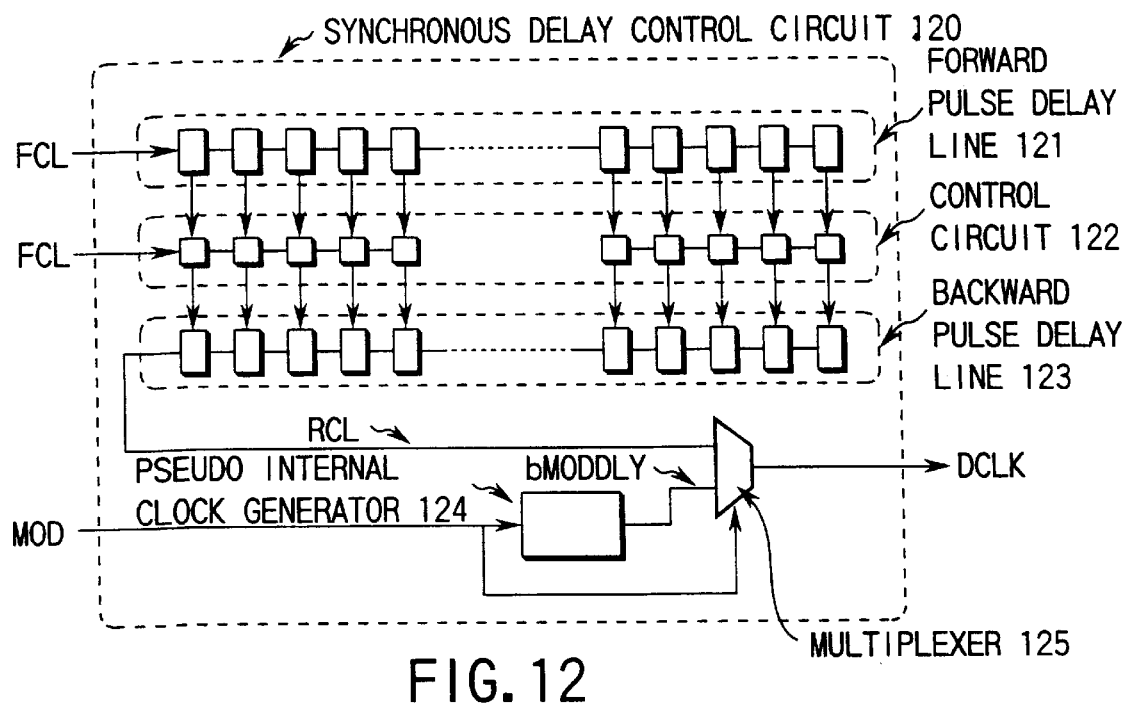
FIG. 12 is a block diagram showing a detailed circuit configuration of the synchronous delay control circuit in FIG. 9.

As shown in FIG. 12, the synchronous delay control circuit 120 includes a forward pulse delay line 121, a control circuit 122, and a backward pulse delay line 123, and further a pseudo internal clock signal generator circuit 124 for outputting a pseudo internal clock signal, a measuring signal, in a delay measuring mode.

Figure 13:
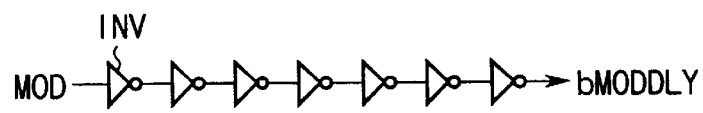
FIG. 13 is a block diagram showing an example of the configuration of the pseudo internal clock generator circuit in FIG. 12.

The pseudo internal clock signal generator circuit 124, which is composed of, for example, odd stages (in this case, seven stages) of inverters INV as shown in FIG. 13, outputs a signal bMODDLY obtained by delaying, for a specific time, a mode change signal MOD supplied in the delay measuring mode and inverting the polarity of the delayed signal.

The mode change signal MOD is a signal that goes to the low level for a specific time Tm, when the inside of the chip has been initialized after the turning on of the power supply to the semiconductor integrated circuit chip.

Figure 15:
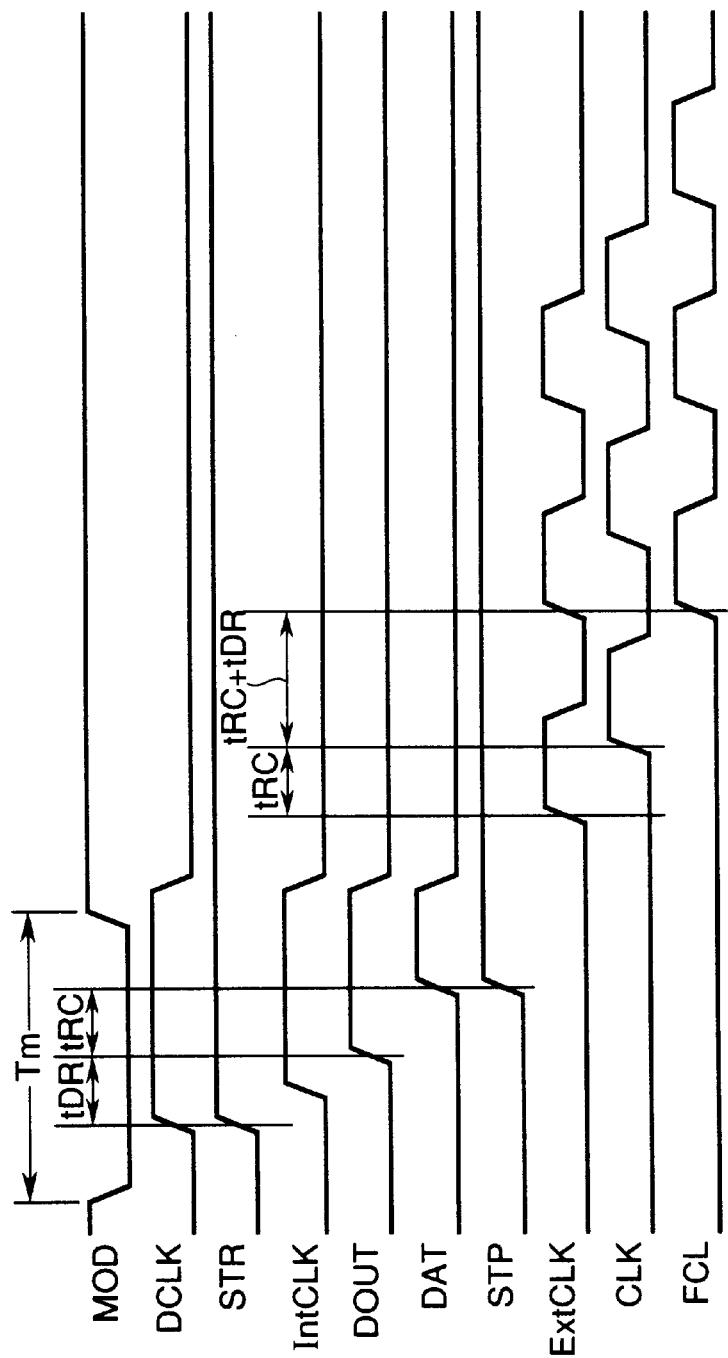
FIGS. 15A to 15J are timing charts to help explain the operation of the semiconductor integrated circuit according to the first embodiment.

The output bMODDLY of the pseudo internal clock generator circuit 124, together with the output RCL of the backward pulse delay line 123, is supplied to a multiplexor 125. The multiplexor 125 selects an inverted delay signal bMODDLY when the signal MOD is at the low level and a signal RCL when the signal MOD is at the high level and outputs a pseudo internal clock signal DCLK as shown in FIG. 15B.

Figure 14:
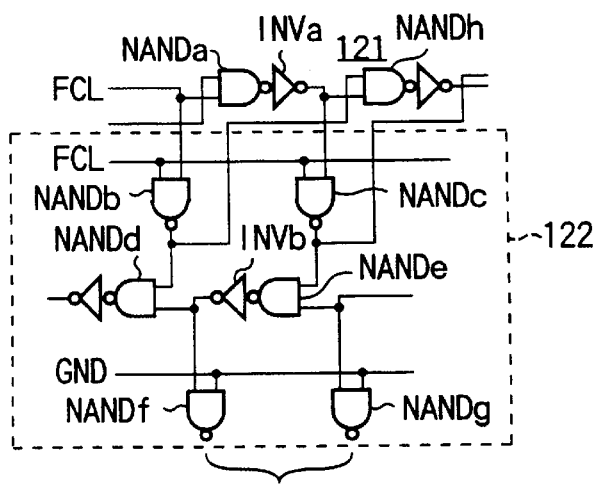
FIG. 14 is a block diagram showing part of the synchronous delay control circuit of FIG. 12 in further detail.

Each component part of the control circuit 122 in the synchronous delay control circuit 120 is composed of, for example, a first NAND element NANDb and a second NAND element NANDc, a third NAND element NANDd and a fourth NAND element NANDe, and NAND elements NANDf, NANDg as shown in FIG. 14. In the forward pulse delay line 121, a signal FCL is inputted to a delay element composed of a NAND element NANDa and an inverter element INVa. The signal FCL and the output of the delay element, together with a clock CLK, are supplied to the first and second elements NANDb, NANDc. The outputs of the first and second elements NANDb, NANDc, together with the outputs of the delay elements at the corresponding subsequent stages of the forward pulse delay line 121, are supplied to the third and fourth NAND elements NANDd, NANDe. The outputs of the fourth element NANDe, together with the output of the NAND element at the corresponding subsequent stage, is supplied via an inverter element INVb to the NAND elements NANDf, NANDg.

In FIG. 14, even if the signal FCL is high, when the signal CLK is at the high level, the output of the element NANDb goes low and is supplied to the element NANDh. As a result, the element NANDh stops the forward pulse from propagating along the forward pulse delay line 121.

At this time, the signal FCL is supplied via the elements NANDc, NANDe, INVb to the element NANDf. The control circuit 122 therefore has the function of transferring the signal FCL to the backward pulse delay line 123. Then, the signal FCL transferred to the backward pulse delay line 123 is propagated and delayed sequentially as a backward pulse RCL over the backward pulse delay line 123. The backward delay line 123 then outputs a signal RCL.

The signal RCL or the pseudo internal clock signal DCLK outputted from the pseudo internal clock signal generator circuit 124 is inputted to not only the clock driver 130 but also the control signal generator circuit 160.

The output of the clock driver 130 is inputted to the output control circuit 140. The output control circuit 140 then outputs an internal clock signal IntCLK synchronizing with the external clock signal ExtCLK.

Not only the pseudo internal clock signal DCLK but also the data signal DAT outputted from the data receiver 240 in the data input/output circuit 200 and the mode change signals MOD, /MOD are supplied to the control signal generator circuit 160. In the delay measuring mode, the control signal generator circuit 160 generates a measurement start signal STR and a measurement stop signal STP for controlling the operation of the delay monitor 150 on the basis of the pseudo internal clock signal DCLK and data signal DAT. The measurement start signal STR and measurement stop signal STP are supplied to the delay monitor 150.

In the delay measuring mode in the period Tm in FIG. 15A, a delay of tDR+tRC for the signal CLK is set in the delay monitor 150 on the basis of the input timing for the measurement start signal STR and measurement stop signal STP shown in FIGS. 15C and 15G. After the completion of the delay measuring mode period Tm, the signal CLK outputted from the clock receiver 110 is caused to lag behind by the delay tDR+tRC set in the delay measuring mode. The delayed signal is then supplied to the synchronous delay control circuit 120.

The data input/output circuit 200 is composed of a data input/output amplifier 210, an output buffer 220, an output driver 230, and a data receiver 240.

The data input/output amplifier 210 amplifies and waveform-shapes the input/output data exchanged between the internal circuit (not shown) and an external data bus explained later. The data from the data input/output amplifier 210 during data output is inputted to the output buffer 220. Not only the output data but also the internal clock signal IntCLK outputted from the internal clock signal generator circuit 100 are inputted to the output buffer 220. The output buffer 220 then outputs data in synchronization with the internal clock signal IntCLK. The data is outputted via an output driver 230 to the external data bus represented by an equivalent circuit 30 composed of a resistance 31 and a capacitance 32.

When data is inputted, the data on the external data bus 30 is taken in by the data receiver 240, which then inputs it to the data input/output amplifier 210. The data signal DAT based on the data taken in by the data receiver 240 is supplied to the control signal generator circuit 160.

As described above, the circuit 30 is an equivalent circuit equivalently representing the controller, external terminal system, and others connected to the external data bus. The terminal resistance 31 and load capacitance 32 represent the component parts of the equivalent circuit 30.

In the semiconductor integrated circuit of FIG. 9, the clock receiver 110 in the internal clock signal generator circuit 100 is designed to have an internal circuit configuration equivalent to that of the data receiver 240 in the data input/output circuit 200. For example, each of them is constructed as shown in FIG. 10.

Figure 10:
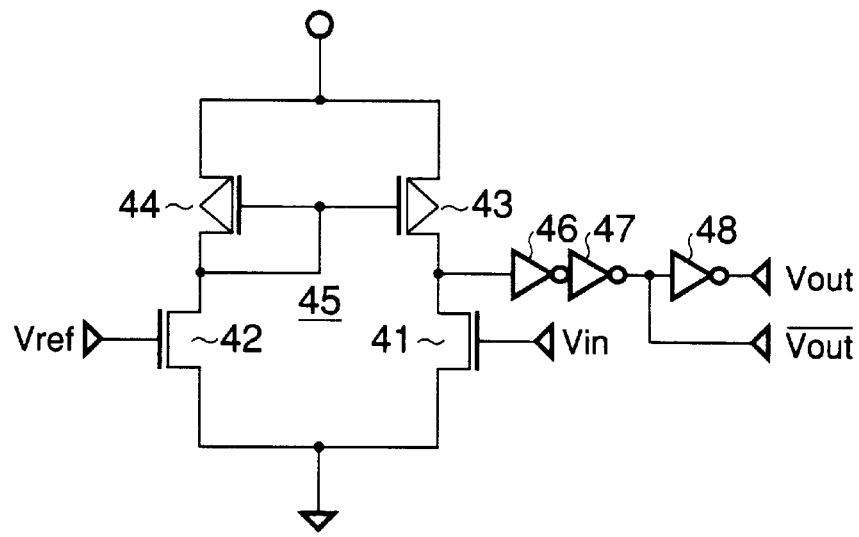
FIG. 10 is a circuit diagram showing a detailed circuit configuration of the clock receiver 11 and data receiver 24 in FIG. 9.

Specifically, FIG. 10 shows a detailed circuit configuration of each of the clock receiver 110 and data receiver 240 in FIG. 9. Each of the receiver 110 and data receiver 240 includes a current-mirror load differential amplifier 45 composed of two n-channel MOS transistors 41, 42 and two p-channel MOS transistors 43, 44, and three inverters 46 to 48 connected in series for amplifying and waveform-shaping the output of the differential amplifier 45 to produce a signal Vout or its inverted signal /Vout.

The external clock signal ExtCLK is supplied as an input signal Vin to the gate of one n-channel MOS transistor 41 constituting the differential amplifier 45 in the case of the clock receiver 110, whereas the data signal DOUT is supplied as an input signal Vin to the gate of one n-channel MOS transistor 41 in the case of the data receiver 240. A reference voltage Vref is supplied to the gate of the other n-channel MOS transistor 42. Then, the signal Vout or its inverted signal /Vout is supplied as the signal CLK to the synchronous delay control circuit 120 in the case of the clock receiver 110, whereas the signal Vout or its inverted signal /Vout is supplied as the data signal DAT to the data input/output amplifier 210 and control signal generator circuit 160 in the case of the data receiver 240.

As described above, because the equivalent circuit configuration is used in both of the clock receiver 110 in the internal clock signal generator circuit 100 and the data receiver 240 in the data input/output circuit 200, the delays (signal delay times) in both of the circuits practically the same.

Figure 11:
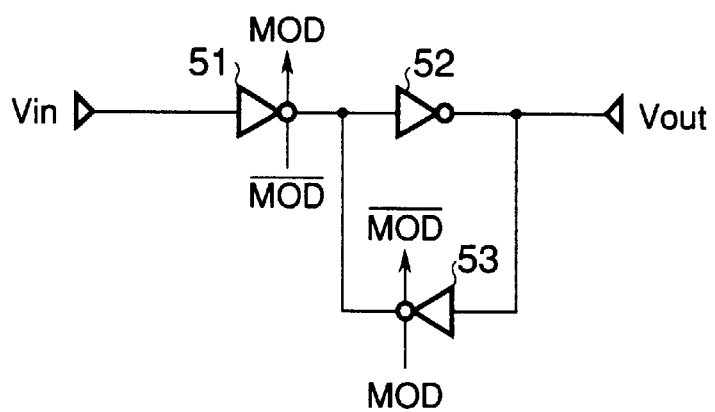
FIG. 11 is a circuit diagram of a latch circuit provided in the control signal generator circuit 16 of FIG. 9.

In the control signal generator circuit 160 of FIG. 9, two units of a latch circuit constructed as shown in FIG. 11 are provided to generate the measurement start signal STR and measurement stop signal STP. The latch circuit is composed of a clocked inverter 51, an inverter 52 for inverting the output of the clocked inverter 51, and a clocked inverter 53. The input signal Vin is inputted to the clocked inverter 51, with the delay-measuring mode signal MOD being inputted to its p-channel side clock gate and the inverted signal /MOD being inputted to its n-channel side clock gate. The output signal Vout from the inverter 52 is inputted as an input signal to the clocked inverter 53, with the delay-measuring mode signal MOD being inputted to its n-channel side clock gate, the inverted signal /MOD being inputted to the p-channel side clock gate, and its output signal being fed back to the input side of the inverter 52.

The output signal from the synchronous delay control circuit 120 is inputted as the input signal Vin in the case of the latch circuit for generating the measurement start signal STR, whereas the output signal from the data receiver 240 is inputted as the input signal Vin in the case of the latch circuit for generating the measurement stop signal STP. The output signals Vout of both latch circuits are either the measurement start signal STR or measurement stop signal STP.

The operation of the circuits constructed as described above will be described by reference to timing charts in FIGS. 15A to 15J. First, the delay measuring mode MOD changes to the low level (its inverted signal /MOD changes to the high level) and goes into the delay measuring mode with a measuring period of TM. As a result, in the latch circuit of FIG. 11, the inverter 51 is activated and the inverter 53 is deactivated, which cancels the latched state.

Next, the synchronous delay control circuit 120 outputs a high pseudo internal clock signal DCLK. The pseudo internal clock signal DCLK passes through the clock driver 130 and output control circuit 140 and is outputted as an internal clock signal IntCLK. In synchronization with the internal clock signal IntCLK, the output buffer 220 outputs pseudo data (high-level data) from the data input/output amplifier 210. The pseudo data passes through the output driver 230 and is outputted as output data DOUT to the external data bus 30. After being caused to lag behind the timing of the generation of the pseudo internal clock signal DCLK by the output delay tDR, the output data DOUT of FIG. 15E is outputted to the external data bus 30.

In parallel with this, the pseudo internal clock signal DCLK is inputted to the control signal generator circuit 160, which then outputs a high measurement start signal STR. The signal STR is used as a delay time measurement start signal in the delay monitor 150.

On the other hand, the high-level pseudo data outputted to the external data bus 30 is taken in by the data receiver 240. After the input delay tRC has elapsed since the pseudo data appeared on the external data bus 30, the pseudo data is outputted as the data signal DAT of FIG. 15F. The data signal DAT is inputted to the control signal generator circuit 160, which then outputs a high measurement stop signal STP with the timing of FIG. 15G. The signal STP is used as a delay time measurement stop signal in the delay monitor 150.

On the basis of the timing of the input of the measurement start signal STR and measurement stop signal STP, the delay monitor 150 sets a delay for the output signal CLK from the clock receiver 110.

Next, when the delay measuring mode period Tm has finished, the delay measuring mode signal MOD goes to the high level (its inverted signal /MOD goes to the low level) as shown in FIG. 15A, and the mode changes to the normal operation mode, the two latch circuits in the control signal generator circuit 160 are set in the latched state, which fixes both of the measurement start signal STR and measurement stop signal STP at the high level.

In the delay measuring mode, a delay time of (tDR+tRC) has been set in the delay monitor 150 beforehand. The delay (tDR+tRC) is equivalent to the actual delay time from when the pseudo internal clock signal DCLK is outputted from the synchronous delay control circuit 120, the clock driver 130 and output control circuit 140 delay the pseudo internal clock signal DCLK and output an internal clock signal IntCLK, and the data passes through the output buffer 220 and output driver 230 in synchronization with the delayed internal clock signal IntCLK and is outputted to the external bus 30 until the data outputted onto the external data bus 30 is taken in by the data receiver 240 and the data receiver 240 outputs a data signal DAT.

Because the clock receiver 110 in the internal clock signal generator circuit 100 is designed to have a circuit configuration equivalent to that of the data receiver 240 in the data input/output circuit 200, the delay in the clock receiver 110 is practically the same as the delay tRC in the data receiver 240. This means that the delay time of the input route circuit composed of the clock receiver 110 and the delay of the output route circuit composed of the clock driver 130, output control circuit 140, output buffer 220, and output driver 230 have been set in the delay monitor 150.

Consequently, in the normal operation mode after the completion of the delay measuring mode period Tm, when the external clock signal ExtCLK is inputted as shown in FIG. 15H, the clock receiver 110 outputs the signal delayed for tRC as shown in FIG. 15I, and the delay monitor 150 outputs the signal FCL caused to lag behind the signal CLK by (tDR+tRC) as shown in FIG. 15J. Thereafter, the internal clock signal generator circuit 100 outputs an internal clock signal IntCLK on the basis of the principle of the SAD clocked delay control circuit explained earlier. The data is outputted in synchronization with the internal clock signal IntCLK.

With the semiconductor integrated circuit of the first embodiment, the actual signal delay time in each circuit and the delay time in data output according to the load state of the external data bus 30 can be set in the delay monitor 150 by carrying out the operation in the delay measuring mode with the circuits actually mounted on such a system as a module. This makes it possible to cope with the variously changing delay time in the input route circuit and that in the output route circuit. Thus, the delay monitor 150 enables the actual delay time to be set exactly each time the power supply is turned on.

While in the first embodiment, the control signal generator circuit 160 has been provided in the internal clock generator circuit 100, it may be provided outside the internal clock signal generator circuit 100.

Furthermore, while in the first embodiment, the pseudo internal clock signal output circuit 124 for outputting the pseudo internal clock signal DCLK has been provided in the synchronous delay control circuit 120, it may be provided outside the synchronous delay control circuit 120.

Figure 16:
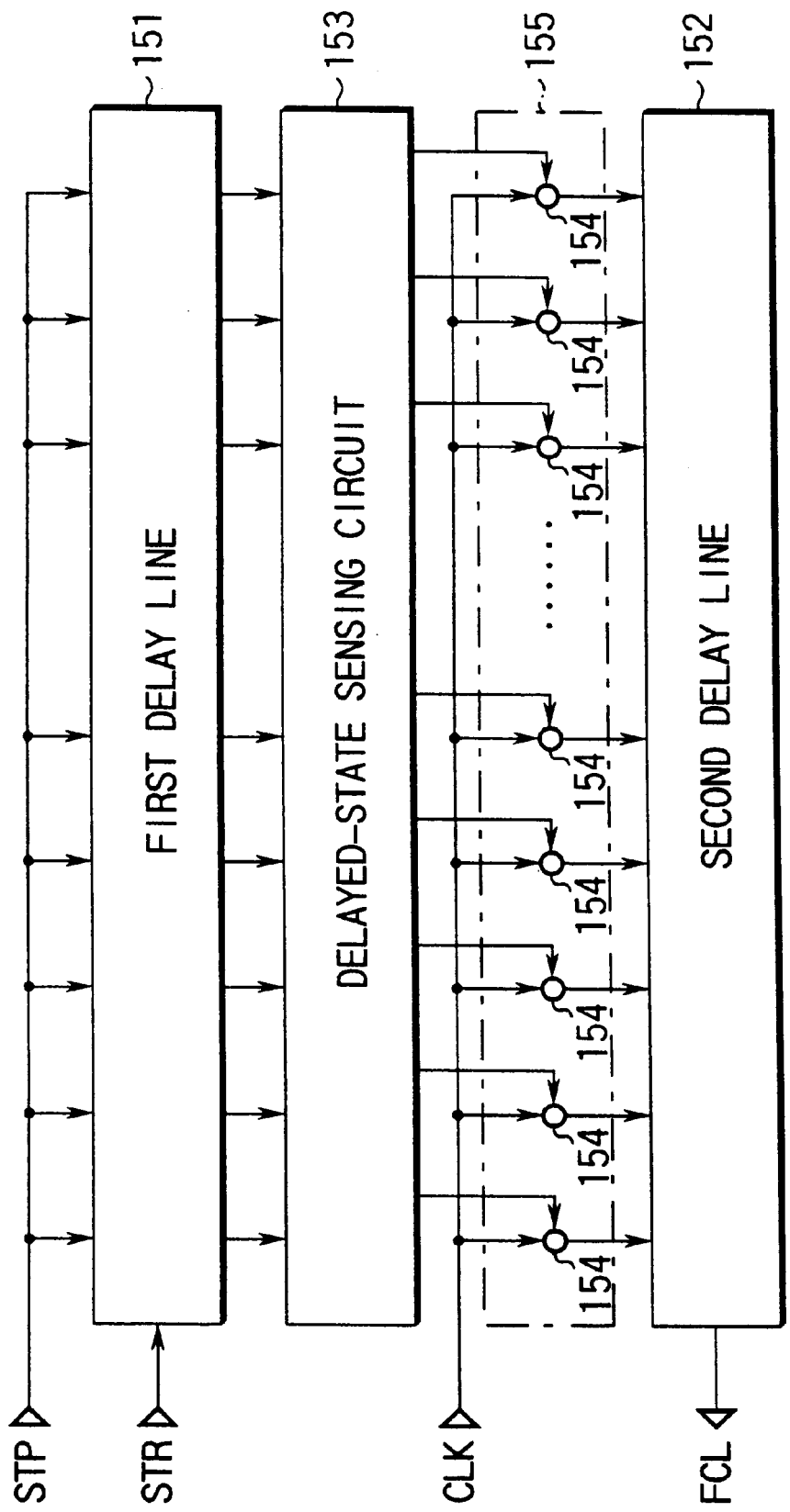
FIG. 16 is a block diagram showing an internal configuration of the delay monitor 15' in FIG. 9.

FIG. 16 is a block circuit showing an internal configuration of the delay monitor 150 in FIG. 9. The delay monitor 150 includes a first and a second delay lines 151 and 152 each composed of unit delay circuits connected in a multistage manner, a delay state sensing circuit 153, and a switch circuit group 155 composed of switch circuits 154.

The measurement start signal STR and measurement stop signal STP are inputted to a first delay line 151. The measurement start signal STR is delayed and propagated sequentially by the unit delay circuits in the first delay line 151 until the measurement stop signal STP has made a transition (or has changed from the low level to the high level). Then, the position of the unit delay circuit at which the measurement start signal STR has finally arrived in the first delay line 151 is sensed by the delay state sensing circuit 153. According to the result of the sensing at the delay state sensing circuit 153, control is performed in such a manner that the switch circuits 154 in the switch circuit group 155 are selectively made conducting.

The signal CLK outputted from the clock receiver 110 is inputted via the conducting switch circuit 154 to a unit delay circuit in a second delay line 152. The signal CLK is propagated and delayed over as many unit delay circuits in the second delay line 152 as it was in the first delay line 151. Thereafter, the delayed CLK is outputted as the signal FCL.

Figure 17:
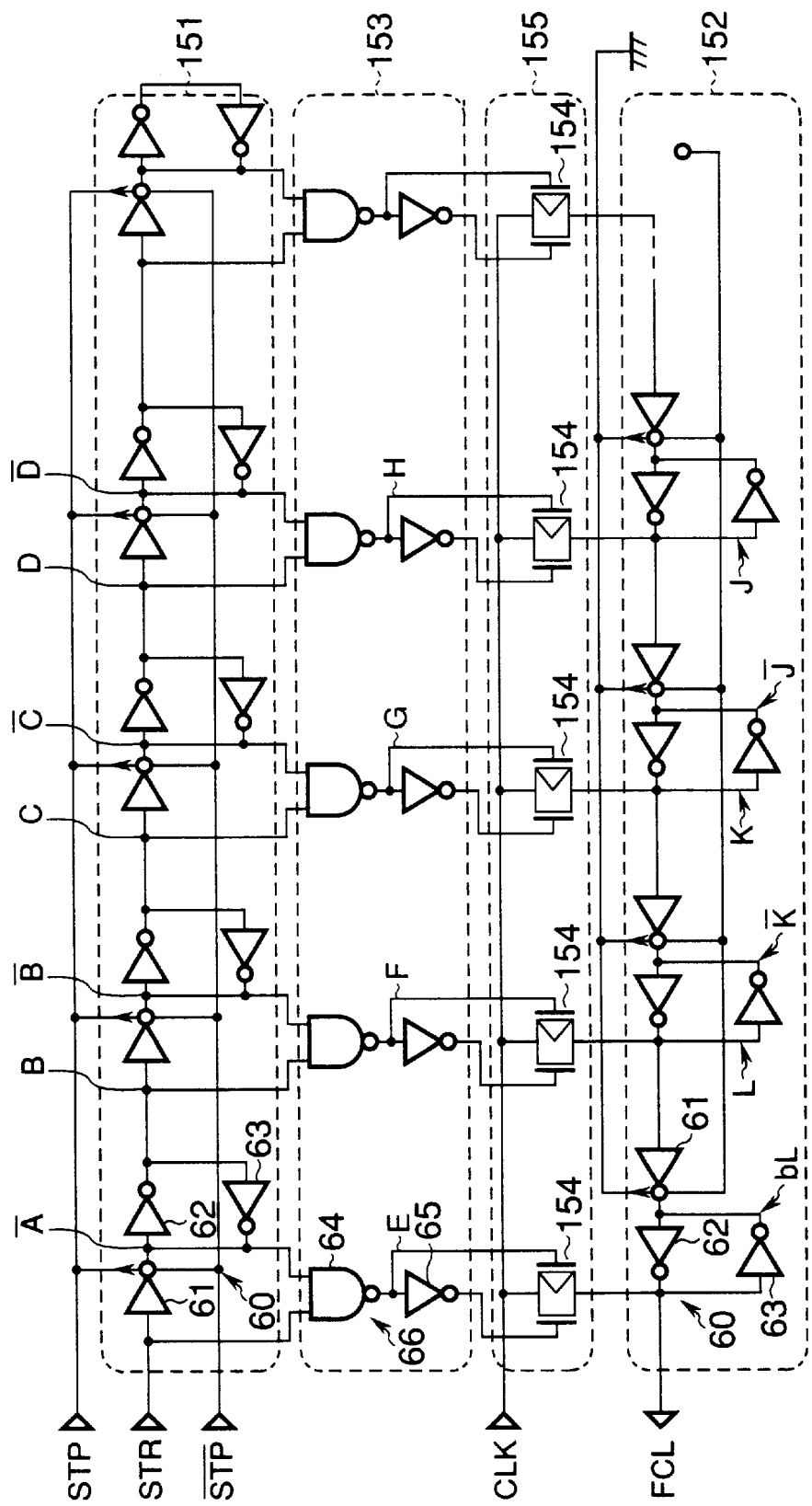
FIG. 17 is a circuit diagram showing a detailed circuit configuration of the delay monitor 15' in FIG. 16.

FIG. 17 shows a detailed circuit configuration of the delay monitor 150 in FIG. 16.

Numeral 60 indicates a unit delay circuit provided in the first delay line 151. Each unit delay circuit 60 is composed of a clocked inverter 61 and two inverters 62, 63. In the clocked inverter 61, the measurement stop signal STP is inputted to its p-channel side clock gate and the inverted signal /STP of the signal STP is inputted to its n-channel side clock gate. The measurement start signal STR is inputted as an input signal to the first stage. To the remaining stages, the output signal from the unit delay circuit at the preceding stage is inputted as an input signal.

The output signal of the clocked inverter 61 is inputted to the inverter 62. The output signal of the inverter 62 is inputted to not only the unit delay circuit 60 at the next stage but also the inverter 63 at the same stage. In addition, the output signal of the inverter 63 is fed back to the input side of the inverter 62.

In the delay state sensing circuit 153, there are provided as many sensing circuits 66 as there are unit delay circuits 60 in the first delay line 151. Each sensing circuit 66 is composed of a NAND circuit 64 and an inverter 65. To the NAND circuit 64 in each sensing circuit 66, the input signal to the clocked inverter 61 in the corresponding unit delay circuit 60 and the output signal from the same unit delay circuit 60 are inputted. The output signal of each NAND circuit 64 is inputted to the corresponding inverter 65. The output signal of each NAND circuit 64 and the output signal of each inverter 65 are inputted as sense signals to the switch circuit group 155.

Each switch circuit 154 in the switch circuit group 155 is composed of a CMOS transfer gate. The CMOS transfer gate is composed of p-channel and n-channel MOS transistors each of whose source and drain are connected in parallel and to whose gate the sense signal outputted from the delay state sensing circuit 153 are inputted. The signal CLK is inputted to one end of each CMOS transfer gate. The output signal from the other end is inputted to the second delay line 152.

In the second delay line 152, there are provided unit delay circuits 60 constructed in a similar manner to the first delay line 151. The ground voltage corresponding to the low level is inputted to the p-channel side clock gate of the clocked inverter 61 and the supply voltage corresponding to the high level is inputted to the n-channel side clock gate in each unit delay circuit 60 provided in the second delay line 152. These clocked inverters 61 are always set in a state that enables the inverting operation of the input signal. The output signal of each switch circuit 154 in the switch circuit group 155 is inputted to the clocked inverter 61 in each unit delay circuit 60.

Now, the operation of the delay monitor with the configuration of FIG. 17 will be described by reference to timing charts in FIGS. 18A to 18T.

Figure 18:
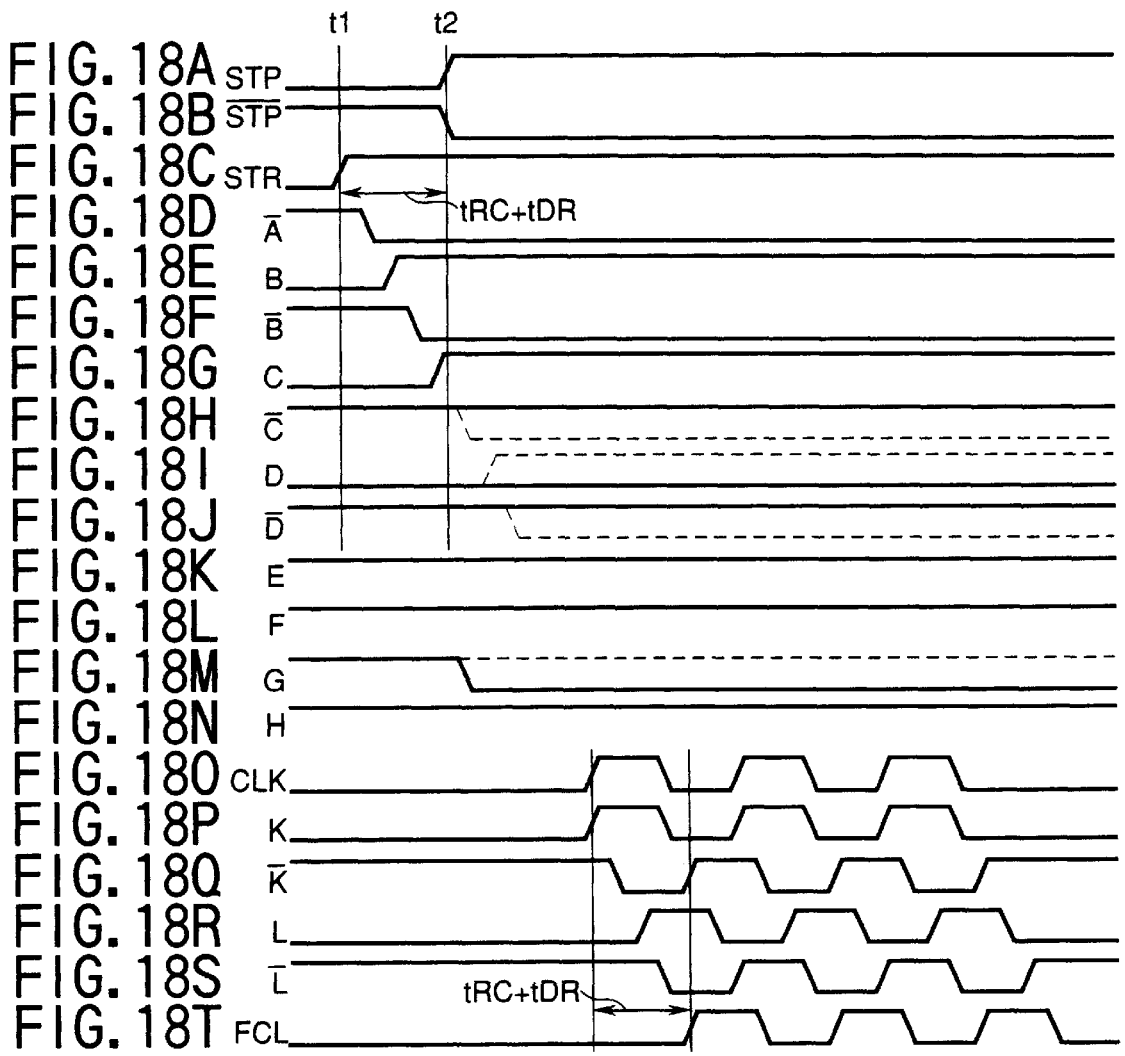
FIGS. 18A to 18T are timing charts to help explain the operation of the delay monitor in FIG. 17.

First, at time t1, the measurement start signal STR shown in FIG. 18C goes to the high level. At this time, as shown in FIGS. 18A and 18B, because the measurement stop signal STP is at the low level (signal /STP is at the high level), the clocked inverter 61 in each unit delay circuit 60 in the first delay line 151 becomes operable, which allows the measurement stop signal STP to propagate from the clocked inverter 61 to inverter 62 in the unit delay circuit 60 at the first stage, from the clocked inverter 61 to inverter 62 in the unit delay circuit at the second stage, . . . , sequentially. If the output node of the clocked inverter 61 in the unit delay circuit 60 at the first stage is /A and the output node of the inverter 62 is B as shown in FIG. 18D, the output node of the clocked inverter 61 in the unit delay circuit 60 at the second stage is /B as shown in FIG. 18E, the output node of the inverter 62 is C as shown in FIG. 18G, the output node of the clocked inverter 61 in the unit delay circuit 60 at the third stage is /C as shown in FIG. 18H, the output node of the inverter 62 is D as shown in FIG. 18I, and the output node of the clocked inverter 61 in the unit delay circuit 60 at the fourth stage is /D as shown in FIG. 18J, the signal at each of these nodes alternates between the high level and low level.

It is assumed that after the signal at node C has been inverted, the measurement stop signal STP goes to the high level at time t2 before the signal at node /C is inverted. The time difference t2−t1 between the measurement start signal STR and the measurement stop signal STP is equal to the total time of the delay time tRC in the input route circuit and the delay time tDR in the output route time as explained in FIGS. 15A to 15J.

When the measurement stop signal STP has gone to the high level, the clocked inverter 61 in each unit delay circuit 60 in the first delay line 151 become inoperable. At that time, the propagation of the signal stops, and the signals at both of node C and node /C go to the high level. This state is sensed by the delay state sensing circuit 153. Of the output nodes E, F, G, H of the four NAND circuits 64 sensing the state of the unit delay circuit 60 at each of the first to fourth stages in the first delay line 151 shown in FIGS. 18K to 18N, only the signal at output node G of the NAND circuit 64 corresponding to the unit delay circuit 60 at the third stage shown in FIG. 18M goes to the low level. The switch circuit 154 to which the signal at node G and its inverted signal are inputted becomes conducting.

Thereafter, when the signal CLK is inputted, the signal CLK is inputted to the second delay line 152 via the switch circuit 154 to which the signal at node G and its inverted signal are inputted in the switch circuit group 155. The signal CLK is then propagated and delayed through as many stages (in this example, two stages) of unit delay circuits 60 as the measurement start signal STR was in the first delay line 151, such as nodes K, /K, L, and /L in the second delay line 152. Then, the delayed signal is outputted as the signal FCL from the unit delay circuit 60 at the first stage.

Node K and node /K are the input node and output node of the clocked inverter 61 in the unit delay circuit 60 at the second stage. Node L and node /L are the input node and output node of the clocked inverter 61 in the unit delay circuit 60 at the first stage (beginning stage).

Therefore, the time difference between the signal CLK and signal FCL at that time is equal to the sum of the delay time tRC of the input route circuit and the delay time tDR of the output route circuit.

As described above, in the delay monitor of FIG. 17, the delay time of the signal FCL to the signal CLK can be set with high accuracy.

In addition, there is no need to provide a pseudo data input/output route circuit in the delay monitor differently from a conventional equivalent. Thus, huge-sized transistors provided in the output driver or the like are not necessary, which prevents the circuit area from increasing.

Because the delay monitor uses no pseudo data input/output route circuit, a current-mirror circuit requiring a large drawn current is not necessary. This prevents the drawn current from increasing in the low power consumption mode, such as the power down mode.

As described above, with the semiconductor integrated circuit of the first embodiment, the increase of the circuit area can be suppressed as much as possible. In addition, the drawn current is prevented from increasing. Even when the manufacturing process conditions and temperature, supply voltage, and the environment for the external data bus have changed, the internal clock signal always synchronizing accurately with the external clock signal can be generated, which enables the output of the data synchronizing with the external clock signal with high accuracy.

The delay-time setting accuracy in the delay monitor of FIG. 17 is quantized on the basis of the delay time necessary for the measurement start signal STR to propagate along two stages of logic gates composed of the clocked inverter 61 and inverter 62. Consequently, further improvements in the accuracy cannot be expected.

Figure 19:
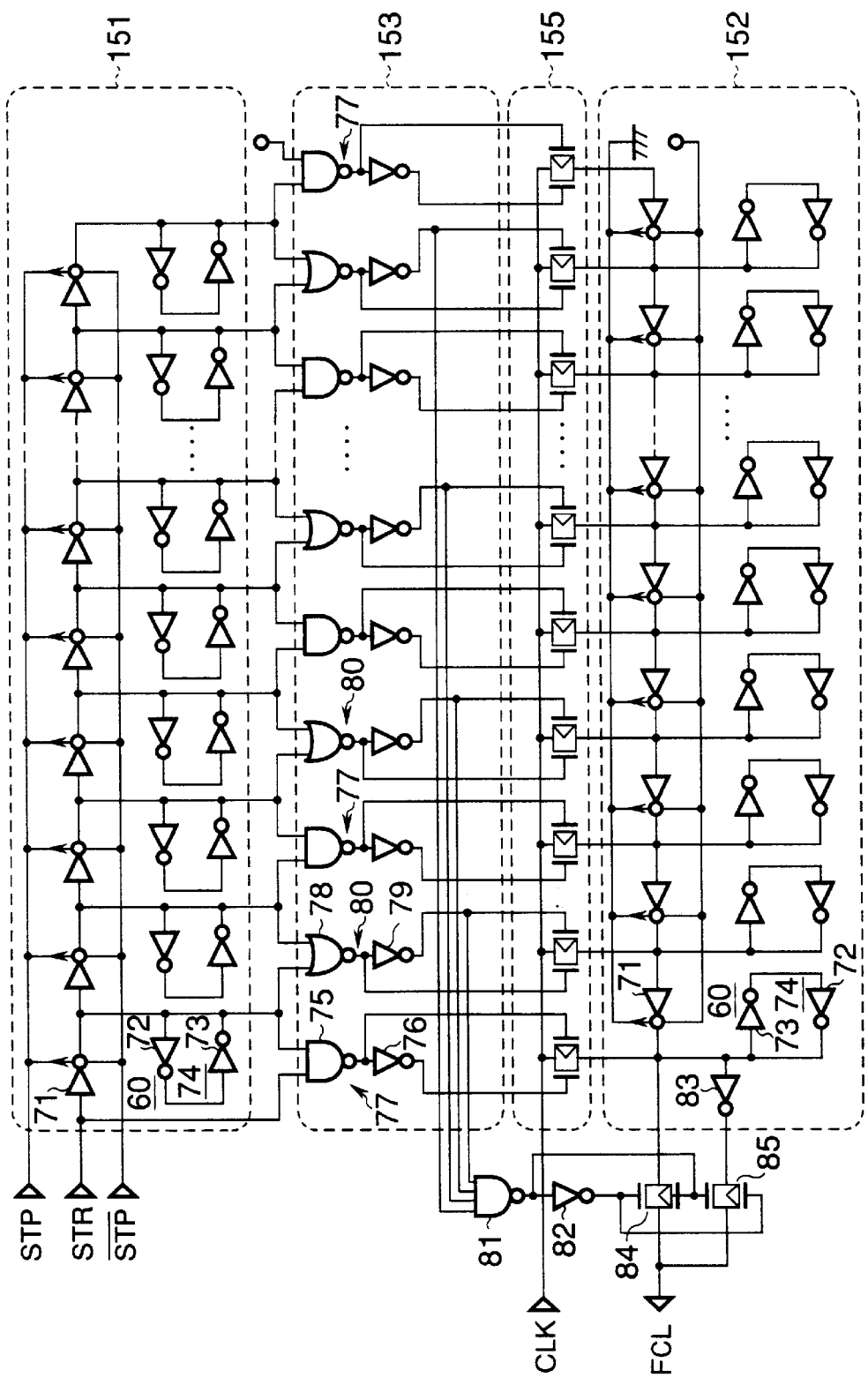
FIG. 19 is a circuit diagram showing another detailed circuit configuration of the delay monitor 15' in FIG. 16.

FIG. 19 shows another detailed circuit configuration of the delay monitor 150 in FIG. 16. The delay monitor of FIG. 19 is such that the delay monitor of FIG. 19 is improved to increase the delay-time setting accuracy. The unit delay circuit 60 at each stage in each of the first and second delay lines 151, 152 includes a clocked inverter 71 and a latch circuit 74 composed of two inverters 72, 73 connected to the output node of each clocked inverter 61.

In the delay state sensing circuit 153, a first sensing circuit 77 composed of a NAND circuit 75 and an inverter 76 for inverting the output signal of the NAND circuit 75 and a second sensing circuit 80 composed of a NOR circuit 78 and an inverter 79 for inverting the output signal of the NOR circuit 78 are provided alternately. The input/output signal of the corresponding unit delay circuit 60 is inputted to the NAND circuit 75 in the first sensing circuit 77 corresponding to the unit delay circuit 60 at an odd-numbered stage in the first delay line 151. The input/output signal of the corresponding unit delay circuit 60 is inputted to the NOR circuit 78 in the second sensing circuit 80 corresponding to the unit delay circuit 60 at an even-numbered stage in the first delay line 151.

Furthermore, in the delay state sensing circuit 153, an additional first sensing circuit 77 is provided in such a manner that it is adjacent to the second sensing circuit 80 corresponding to the unit delay circuit 60 at the last stage in the first delay line 151 (for example, the unit delay circuit at the last stage is assumed to be the unit delay circuit at an even-numbered stage). The output signal of the unit delay circuit 60 at the last stage in the first delay line 151 and the high level are inputted to the NOR circuit 78 in the additional first sensing circuit 77.

Specifically, if the number of unit delay circuits 60 provided in the first delay line 151 is n, the total sum of the first sensing circuits 77 and second sensing circuits 80 provided in the delay state sensing circuit 153 is (n+1). In the switch circuit group 155, too, (n+1) switches 154 are provided accordingly.

In the delay monitor with the configuration of FIG. 19, when the measurement start signal STR propagates along an odd number of stages of unit delay circuits 60 in the first delay line 151, a problem arises: the output signal of the unit delay circuit 60 at the last stage has the opposite phase to that of the measurement start signal STR.

Consider a case where the measurement start signal STR has propagated along three stages of unit delay circuit 60 in the first delay line 151 (or the measurement start signal STR could not pass through the clocked inverter 71 at the fourth stage). In this case, both of the input signal and output signal of the clocked inverter 71 at the fourth stage go to the low level, which causes the output signal of the NOR circuit 78 in the second sensing circuit 80 to which the two signals are inputted to go to the high level. The output signal of the inverter 79 for inverting the signal goes to the low level. Then, the switch 154 in the switch circuit group 155 to which the sense signal of the second sensing circuit 80 is inputted becomes conducting, allowing the signal CLK to be inputted to the input terminal of the clocked inverter 71 at the third stage, counting from the output side of the second delay line 152. This causes the signal CLK to be inverted via the three clocked inverters 71 in three unit delay circuits 60 in the second delay line 152. The resulting signal is outputted as the signal FCL. Thus, the signal FCL, too, has the opposite phase to that of the signal CLK.

In FIG. 19, when the measurement start signal STR has propagated along an odd number of unit delay circuits 60 in the first delay line 151, the final signal FCL is obtained by inverting the output signal from the unit delay circuit 60 at the last stage in the second delay line 152.

In the delay monitor of FIG. 19, to sense the fact that the measurement start signal STR has propagated along an odd number of unit delay circuits 60 in the first delay line 151, there are provided a NAND circuit 81 to which the output signals of the individual inverters 79 in all the second sensing circuits 80 in the delay state sensing circuit 153 are inputted and an inverter 82 for inverting the output signal of the NAND circuit 81.

Further provided in the delay monitor are an inverter 83 for inverting the output signal from the unit delay circuit 60 at the last stage in the second delay line 152, a CMOS transfer gate 84 connected between the output signal from the unit delay circuit 70 at the last stage in the second delay line 151 and the node for signal FCL, and a CMOS transfer gate 85 connected between the output terminal of the inverter 83 and the node for signal FCL.

In one CMOS transfer gate 84, the output signal of the NAND circuit 81 is inputted to the gate of its p-channel MOS transistor and the output signal of the inverter 82 is inputted to the gate of its n-channel MOS transistor. In the other CMOS transfer gate 85, the output signal of the inverter 82 is inputted to the gate of its p-channel MOS transistor and the output signal of the NAND circuit 81 is inputted to the gate of its n-channel MOS transistor.

In the delay monitor with such a configuration, when the measurement start signal STR has propagated along an odd number of unit delay circuits 60 in the first delay line 151, the output signal of the inverter 79 in any one of the second sensing circuits 80 in the delay state sensing circuit 153 goes to the low level. At this time, the output signal of the NAND circuit 81 goes to the high level and the output signal of the inverter 82 goes to the low level, which causes the CMOS transfer gate 85 to become conducting. As a result, in this case, the output signal from the unit delay circuit 60 at the last stage in the second delay line 152 is inverted at the inverter 83, which outputs the inverted signal as the signal FCL.

On the other hand, when the measurement start signal STR has propagated along an even number of unit delay circuits 60 in the first delay line 151, the output signals of the inverters 79 in all the second sensing circuits 80 in the delay state sensing circuit 153 all go to the high level. At this time, the output signal of the NAND circuit 81 goes to the low level and the output signal of the inverter 82 goes to the high level, which causes the CMOS transfer gate 84 to become conducting. In this case, the output signal from the unit delay circuit 60 at the last stage in the second delay line 152 passes through only the CMOS transfer gate 84. The resulting signal is outputted as the signal FCL.

That is, use of the delay monitor with the configuration of FIG. 19 enables the delay-time setting accuracy to be increased and a high-accuracy delay monitor to be realized.

Although the delay monitor of FIG. 19 assures an improved delay setting accuracy, the number of input terminals of the NAND circuit 81 increases as the number of stages of unit delay circuits in the first and second delay lines 151, 152 increases, resulting in an increase in the circuit area.

Figure 20:
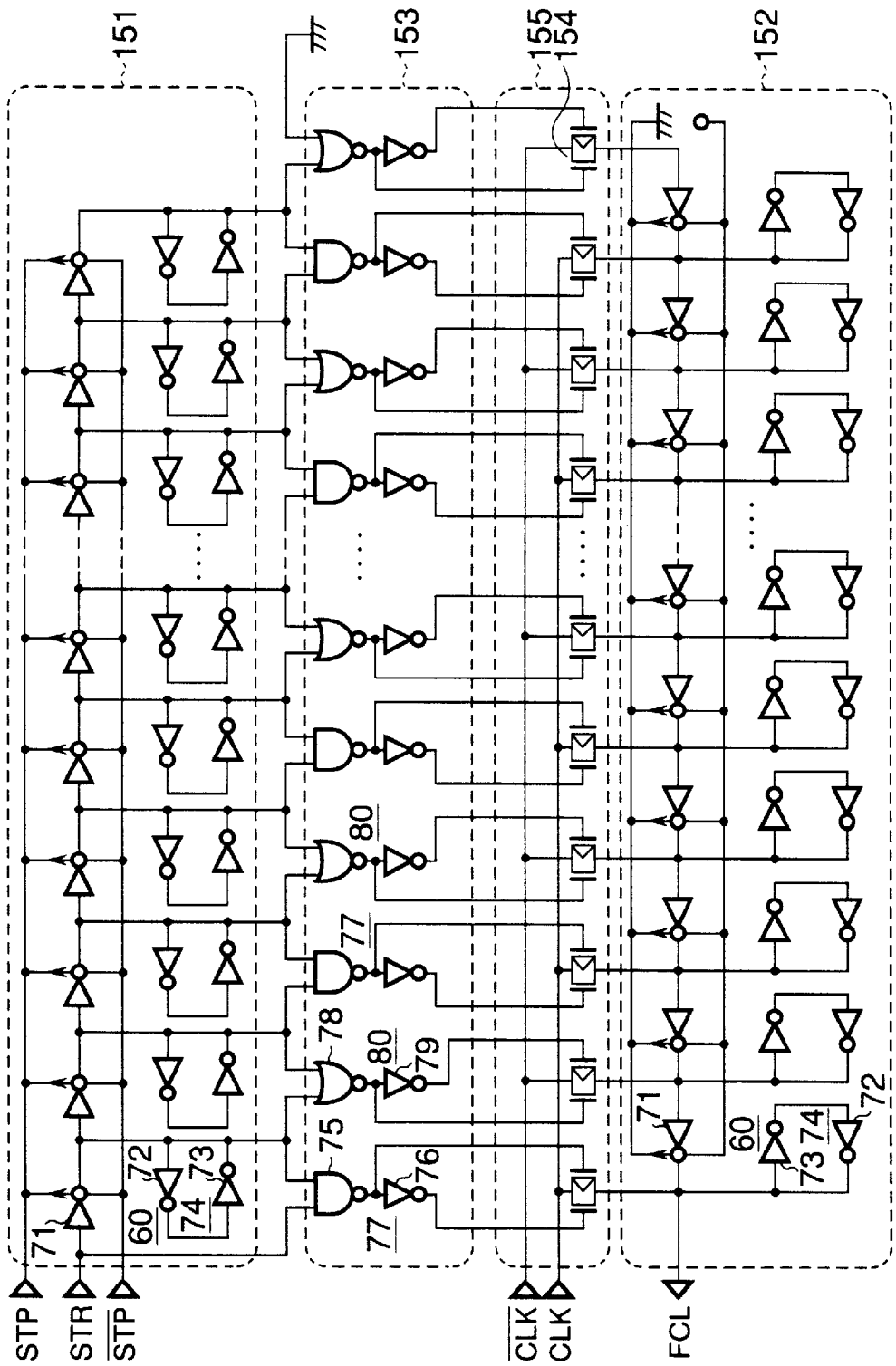
FIG. 20 is a circuit diagram showing still another detailed circuit configuration of the delay monitor 15' in FIG. 16.

FIG. 20 shows another detailed circuit configuration of the delay monitor 150 of FIG. 16 capable of preventing an increase in the circuit area resulting from an increase in the number of input terminals of the NAND circuit 81 in FIG. 19.

The delay monitor of FIG. 20 differs from that of FIG. 19 in that the signal CLK and its inverted signal /CLK are inputted alternately without providing the NAND circuit 81, inverters 82, 83, and CMOS transfer gates 84, 85. Specifically, the signal CLK is inputted to each switch 154 corresponding to the first sensing circuit 77 in the delay state sensing circuit 153 and the signal /CLK is inputted to each switch circuit 154 corresponding to the second sensing circuit 80.

Because the signal /CLK is outputted as the output signal /Vout in the clock receiver of FIG. 10, it should be used.

With this configuration, when the measurement start signal STR has propagated along an even number of unit delay circuits 60 in the first delay line 151, the signal /CLK obtained by inverting the CLK at the switch circuit group 155 is selected and inputted to the second delay line 152, with the result that the output signal FCL from the second delay line 152 has the same phase as that of the signal CLK.

Furthermore, because the NAND circuit 81 with many inputs as shown in FIG. 19, inverters 82, 83, and CMOS transfer gates 84, 85 are eliminated, a similar delay setting accuracy to that in FIG. 19 can be achieved without increasing the circuit area.

Figure 21:
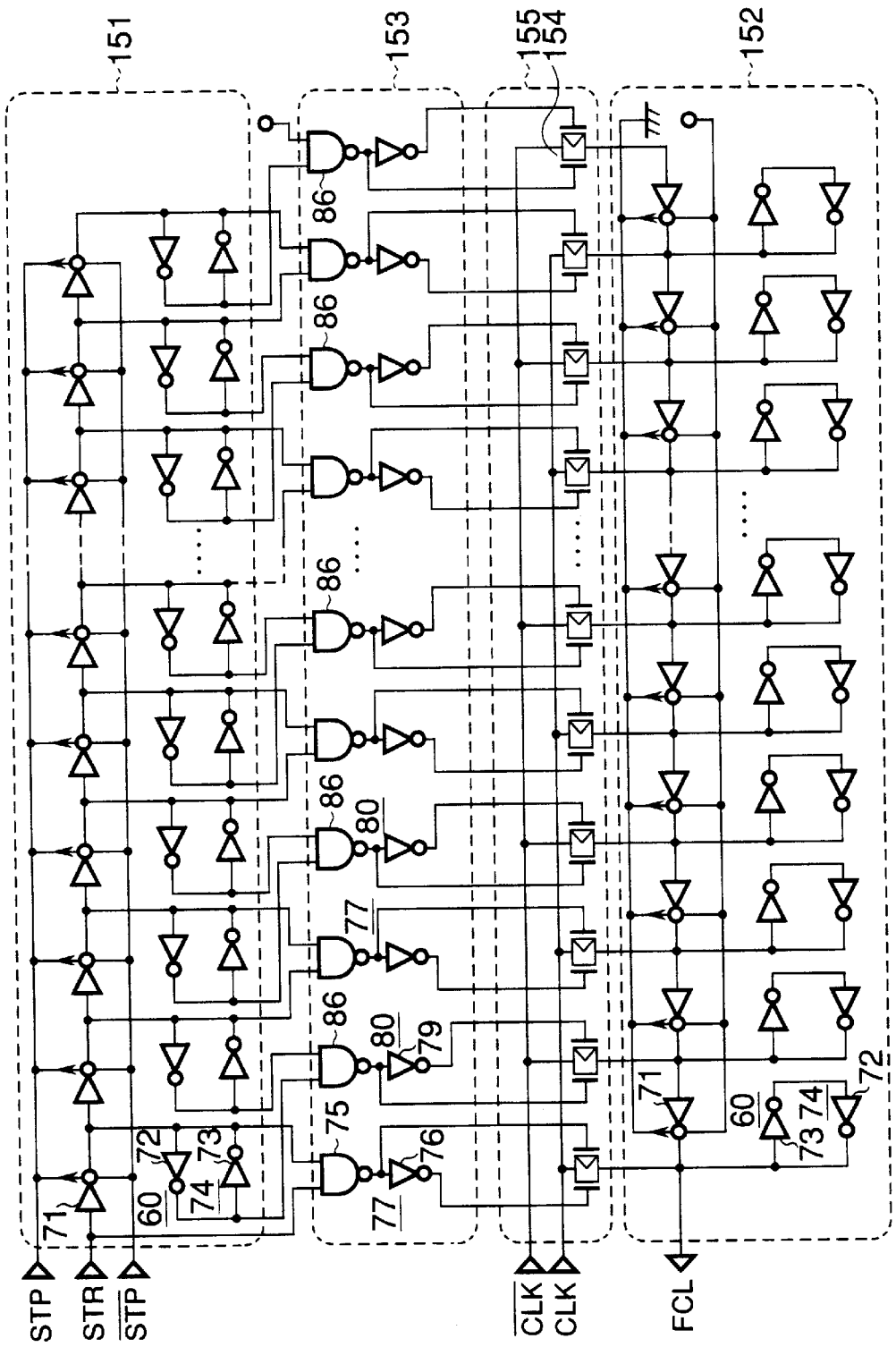
FIG. 21 is a circuit diagram showing still another detailed circuit configuration of the delay monitor 15' in FIG. 16.

FIG. 21 shows another detailed circuit configuration of the delay monitor 150 in FIG. 16.

In the delay monitor in FIGS. 19 or 20, the clocked inverter 71 in the unit delay circuit 60 in the first delay line 151 has to drive the following five types of load capacitances: the input capacitance of the clocked inverter 71 (the gate capacitance of the MOS transistor) in the unit delay circuit 60 at the next stage, the input capacitance of the clocked inverter 72 (the gate capacitance of the MOS transistor), the output capacitance of the clocked inverter 73 (the drain diffused capacitance of the MOS transistor), and the input capacitances of the NAND circuit 75 (the gate capacitance of the MOS transistor) and the NOR circuit 78 (the gate capacitance of the MOS transistor). As the load capacitances driven become greater, the measurement start signal STR propagates along the first delay line 151 at lower speed. A drop in the signal propagation speed on the clocked inverters 71 increases errors in the quantization of delay setting, eventually contributing to a decrease in the accuracy of the delay monitor.

The delay monitor of FIG. 21 is designed to prevent the clocked inverters 71 from decreasing the signal propagation speed. This is realized by converting the NOR circuit 78 in the second sensing circuit 80 of FIG. 20 into a NAND circuit 86 using De Morgan's theorem:

/(X+Y)=/X·/Y

Specifically, a NOR circuit is converted into an AND circuit by inverting each of the two input signals. The inverted signals of the two input signals to each NAND circuit 86 correspond to the inverted signal of the clocked inverter 71 (the output signal of the inverter 72) in the unit delay circuit 60 of the first delay line 151 corresponding to that stage and the inverted signal of the clocked inverter 71 (the output signal of the inverter 72) in the unit delay circuit 60 of the first delay line 151 corresponding to the stage immediately before that stage.

Although a NOR circuit can be converted into an AND circuit, when it is converted into a NAND circuit easy to realize in a CMOS configuration, the logic of the output signal is the reverse of that of the AND circuit.

In the delay monitor of FIG. 21, to prevent the inversion of the logic, the gate control signal to the switch circuit 154 in the switch circuit group 155 is made different from that to the NOR circuit. Specifically, the output signal of the NAND circuit 86 in the second sensing circuit 80 in the delay state sensing circuit 153 is inputted to the gate of the MOS transistor on the p-channel side of each corresponding switch circuit 154 and the output signal of the inverter 79 inverting the output signal of the NAND circuit 86 is inputted to the gate of the MOS transistor on the n-channel side of each corresponding switch circuit 154.

In the delay monitor of FIG. 21, the clocked inverter 71 in the unit delay circuit 60 of the first delay line 151 has to drive four types of load capacitances: the input capacitance of the clocked inverter 71 (the gate capacitance of the MOS transistor) in the unit delay circuit 60 at the next stage, the input capacitance of the clocked inverter 72 (the gate capacitance of the MOS transistor), the output capacitance of the clocked inverter 73 (the drain diffused capacitance of the MOS transistor), and the input capacitance of the NAND circuit 86 or 75 (the gate capacitance of the MOS transistor). Consequently, the load capacitances the clocked inverter 71 has to drive decreases.

As a result, the speed at which the measurement start signal STR propagates along the first delay line 151 increases as compared with that in FIG. 20, which reduces errors in the quantization of delay setting.

In the delay monitor of FIG. 21, the output signal of the clocked inverter 71 collides with the output signal of the inverter 73 of the latch circuit 74 in each unit delay circuit 60 of the first delay line 151. The collision might cause the following problem: when the measurement start signal STR propagates along the first delay line 151, the output signal of the clocked inverter 71 propagates, while inverting the output of the latch circuit composed of the inverters 72 and 73. Now, consider a case where the output signal of the clocked inverter 71 changes from the low level to the high level.

With the n-channel MOS transistor constituting the inverter 73 in the conducting state, the inverter 73 outputs the low-level signal. To make the p-channel MOS transistor constituting the clocked inverter 71 conduct to invert the low-level output to the high-level output, it is necessary for the intermediate voltage determined by the resistance division ratio of the n-channel MOS transistor in the inverter 73 to the p-channel MOS transistor in the clocked inverter 71 to reach the circuit threshold voltage of the inverter 72 and thereby invert the output signal. After the output signal of the inverter 72 has been inverted, the output signal of the inverter 73 is inverted. Therefore, when the measurement start signal STR propagates along the first delay line 151, stopping the operation of the inverter 73 constituting the latch circuit 74 increases the propagation speed, resulting in a higher delay setting accuracy.

However, when the function of the latch circuit 74 is simply stopped, the result of measuring the delay cannot be retained when the measurement stop signal STP is inputted, which prevents the circuit from operating properly.

Figure 22:
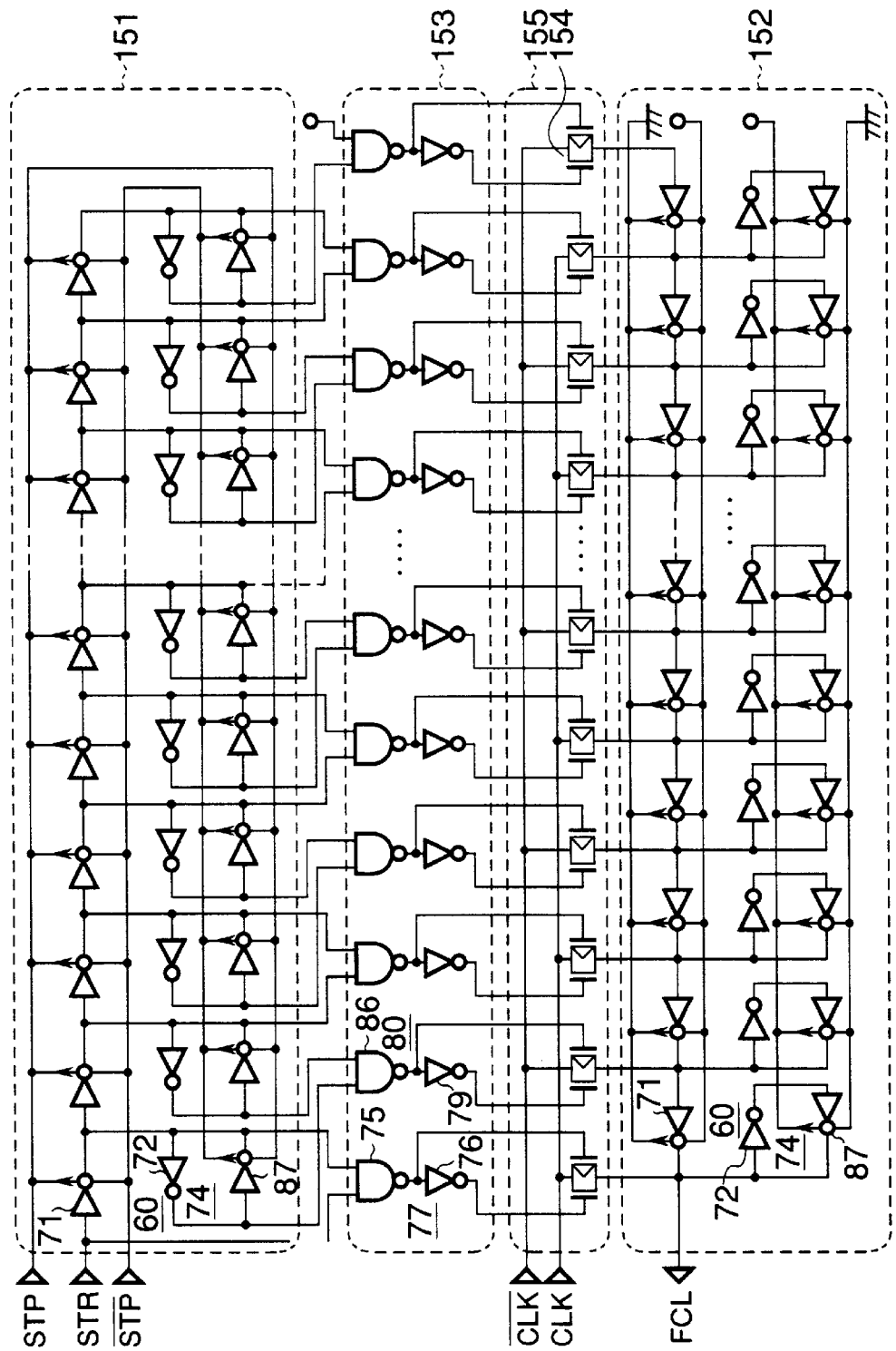
FIG. 22 is a circuit diagram showing still another detailed circuit configuration of the delay monitor 15' in FIG. 16.

To overcome those problems, a delay monitor shown in FIG. 22 has been designed. In the delay monitor of FIG. 22, the inverter 73 in the latch circuit 74 for holding the result of measuring the delay in each unit delay circuit of the first delay line 151 is replaced with a clocked inverter 87 so that the measurement stop signal STP and its inverted signal /STP are inputted to the p-channel and n-channel clock gates in the opposite manner to the way that they are to the clocked inverter 71 for propagating and delaying the measurement start signal STR.

With this configuration, because each of the clocked inverters 87 does not operate, while the measurement start signal STR is being propagated along the first delay line 151, causing no collision between the signals as described above, which improves the propagation speed of the measurement start signal STR more and therefore increases the delay setting accuracy still further.

On the other hand, after the measurement stop signal STP has changed its level, each of the clocked inverters 87 operates as an inverter, causing the latch circuit 74 to operate and hold the result of measuring the delay.

In this case, to adapt the propagation speed of the signal to the first delay line 151, each latch circuit 74 is composed of an inverter 72 and a clocked inverter 87 in the second delay line 152, too. A supply voltage (high level) and the ground voltage (low level) are inputted to the p-channel and n-channel clock gates of the clocked inverter 87 in each latch circuit 74 in the second delay line 152 to prevent the p-channel and n-channel clock gates from operating.

(Second Embodiment)

Figure 23:
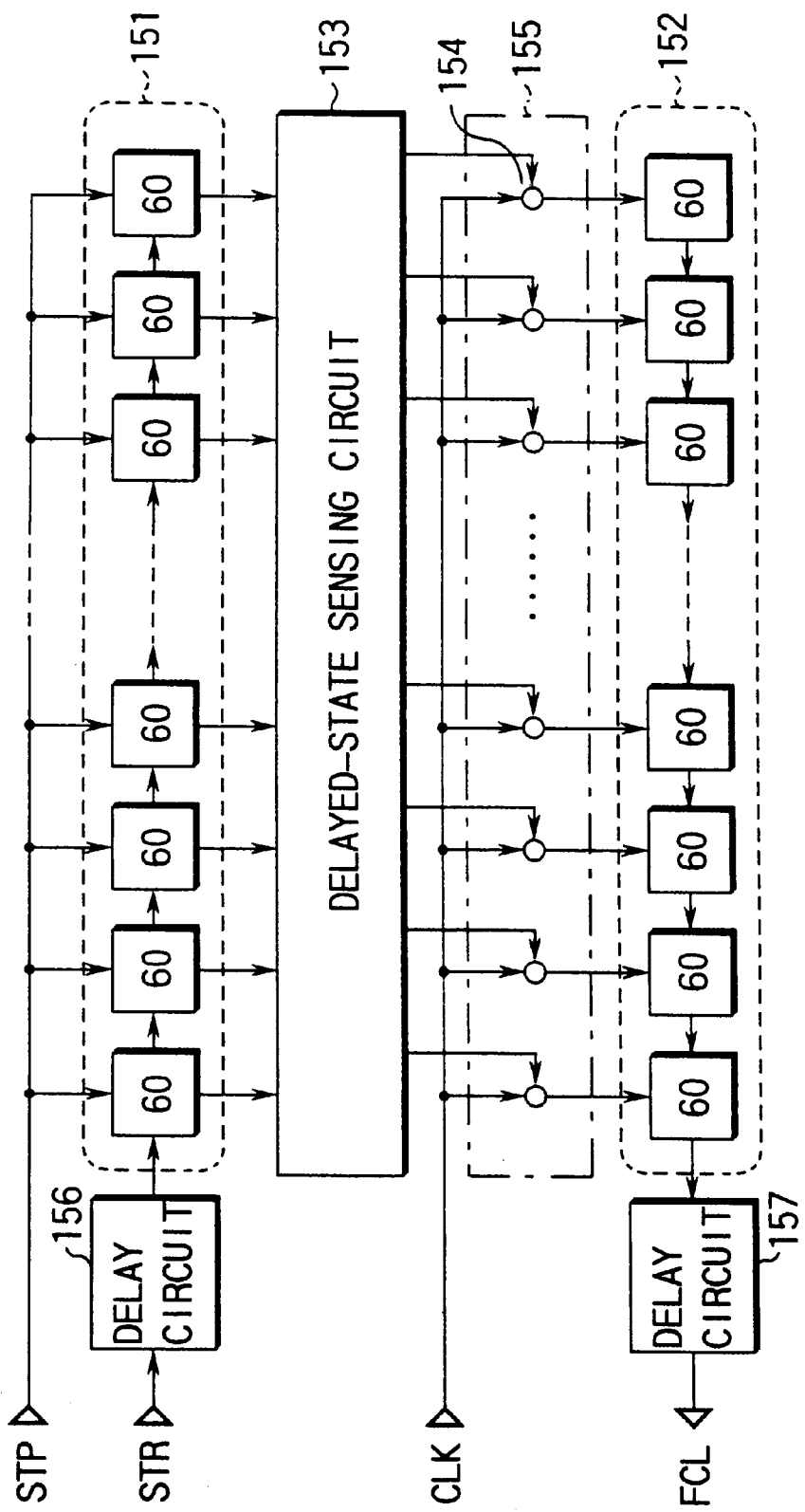
FIG. 23 is a block diagram showing an internal configuration of a delay monitor used in a semiconductor integrated circuit according to a second embodiment of the present invention.

A second embodiment of the present invention will be explained. FIG. 23 is a block diagram showing an internal configuration of a delay monitor used in a semiconductor integrated circuit according to the second embodiment of the present invention.

In the delay monitor according to the first embodiment in FIG. 16, to measure and set a delay with high accuracy in the first delay line 151, many stages of unit delay circuits with a short delay time have to be provided. In the second delay line 152, too, many stages of unit delay circuits 60 with a short delay time have to be provided accordingly.

For example, if the sum of the delay time tRC in the input route circuit and the delay time tDR in the output route circuit is 10 nanoseconds and the propagation delay time per stage of unit delay circuit is 0.1 nanosecond, the number of stages of unit delay circuits necessary to measure the delay is as many as 100 stages. In the second delay line 152, too, the same number of unit delay circuits are necessary. As a result, an increase in the entire circuit area becomes a serious problem.

The second embodiment suppresses the area of the entire circuit as much as possible with no sacrifice in the measuring accuracy.

The delay monitor of FIG. 23 is such that the measurement start signal SRT is inputted via a delay circuit 156 to the first delay line 151 in the delay monitor of the first embodiment and the output signal of the second delay line 152 is delayed by a delay circuit 157, which outputs the resulting signal as a signal FCL.

The delay circuits 156 and 157 have the same circuit configuration and a practically equivalent delay time. Each of the delay circuits 156, 157 delays the signal for the time corresponding to part of the sum of the delay time tRC in the input route circuit and the delay time tDR in the output route circuit.

Figure 24:
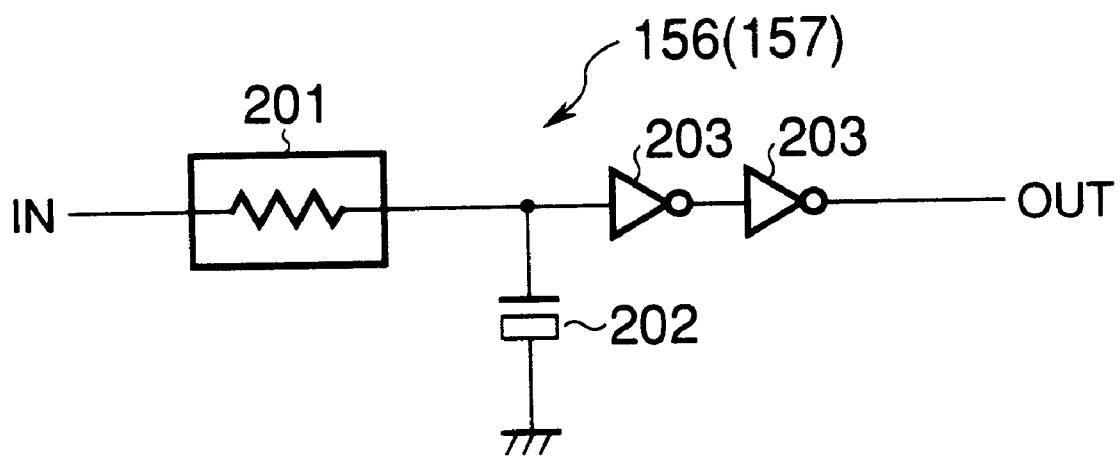
FIG. 24 is a circuit diagram showing a concrete configuration of the delay circuit 156 or 157 used in the semiconductor integrated circuit in FIG. 23.

Used as the delay circuits 156, 157 are, for example, an inverter chain consisting of a series connection of inverters composed of long-channel MOS transistors or a waveform shaping circuit consisting of a low-pass filter composed of a resistance element 201, such as a diffused resistance, and a MOS capacitor 202, and two stages of inverters 203 as shown in FIG. 24.

As described earlier, although the delay time tRC in the input route circuit and the delay time tDR in the output route circuit change variously, depending on the supply voltage, temperature, manufacturing process conditions, the load condition for the external data bus, and others, their minimum values can be found with relative ease by simulation or the like.

When the delays in the delay circuit 156, 157 are set to the minimum values, the number of stages of unit delay circuits in the first and second delay lines 151, 152 are suppressed to the number of stages that compensates for only a variation in the final delay.

For example, it is assumed that the sum of the delay time tRC in the input route circuit and the delay time tDR in the output route circuit varies in the range from 7 nanoseconds to 10 nanoseconds and the delay propagation time per stage of unit delay circuit 60 is 0.1 nanosecond. On this assumption, setting the delays in the delay circuits 156, 156 to a minimum of 7 nanoseconds allows the range of delay time in the unit delay circuit to be 3 nanoseconds since 10 nanoseconds −7 nanoseconds=3 nanoseconds. This delay time range is converted into as few as 30 stages of unit delay circuits. As compared with a case where the first delay line is composed of only unit delay circuits, 70 stages of unit delay circuits are not needed. Instead, it is necessary to provide a delay circuit with a long delay time equivalent to the delay time of 70 stages of unit delay circuits. If such a delay circuit were realized in the area corresponding to 35 stages of unit delay circuits, the area corresponding to the remaining 35 stages of unit delay circuits could be reduced.

In the second delay line 152, too, the delay circuit 157 whose circuit configuration is equivalent to that of the delay circuit 156 is provided, because the delay time must be made equal to that on the first delay line 151. Consequently, the number of unit delay circuits in the second delay line 152 is decreased similarly. On the whole, as many as 70 stages of unit delay circuits are reduced, which decreases the circuit area remarkably.

As described above, with the semiconductor integrated circuit of the second embodiment, the circuit area can be reduced with no sacrifice in the delay measuring accuracy of the delay monitor.

(Third Embodiment)

Figure 25:
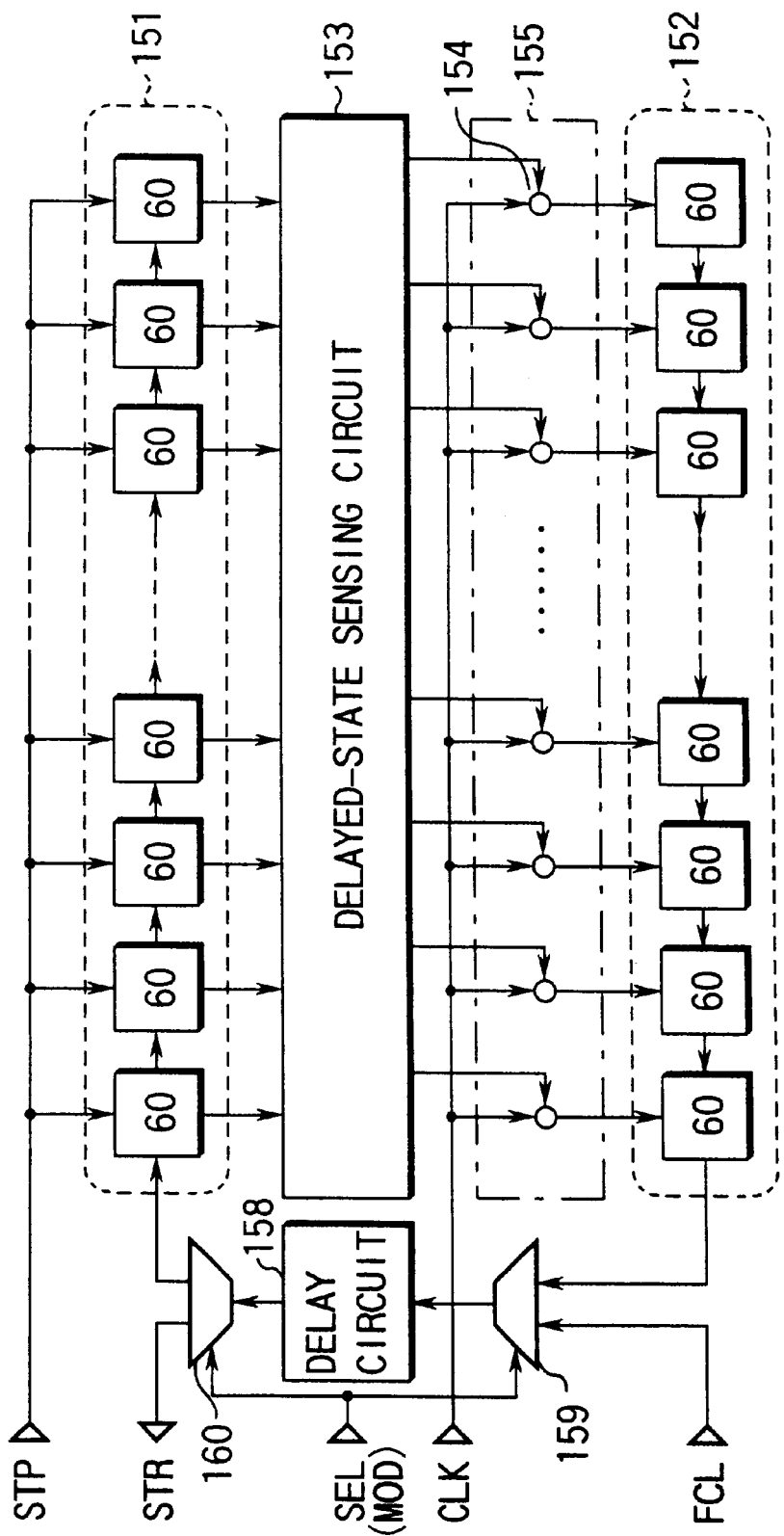
FIG. 25 is a block diagram showing an internal configuration of a delay monitor used in a semiconductor integrated circuit according to a third embodiment of the present invention.

A third embodiment of the present invention will be explained. FIG. 25 is a block diagram showing an internal configuration of a delay monitor used in a semiconductor integrated circuit according to the third embodiment of the present invention.

The delay monitor according to the second embodiment shown in FIG. 23 uses two delay circuits 156, 157 with a long delay time. Even if the delay circuits 156, 157 are designed to have as small a circuit area as possible, they eventually occupy so much a space. In addition, it might be difficult to manufacture two identical delay circuits with a long delay time because of variations in processing conditions and a subtle difference between parasitic capacitances.

To overcome those problems, the third embodiment uses the approach of providing a single delay circuit instead of using two delay circuits and switching the delay circuit between the first and second delay lines according to the period during which the delay circuit is used.

In FIG. 25, numeral 158 indicates a delay circuit corresponding to the delay circuits 156, 157. In the delay monitor of the third embodiment, not only the delay circuit 158 but also a multiplexor 159 and a demultiplexor 160 are added.

According to a select signal SEL, the multiplexor 159 selects the measurement start signal STR and the output signal from the second delay line 152. The output signal from the multiplexor 159 is inputted to the delay circuit 158, which delays it. The delayed output signal from the delay circuit 158 is inputted to the demultiplexor 160. According to the select signal SEL, the demultiplexor 160 either outputs the delayed output signal as the signal FCL to the synchronous delay control circuit 120 (shown in FIG. 9) or inputs the delayed output signal to the first delay line 151. The delay measuring mode signal MOD may be used as the select signal SEL.

For example, when the select signal SEL (or delay measuring mode signal MOD) is at the low level, that is, the delay measuring mode is on, the multiplexor 159 selects the measurement start signal STR. The signal STR is delayed by the delay circuit 158. In the delay measuring mode, the demultiplexor 160 outputs the delayed output signal of the delay circuit 158 to the first delay line 151.

As described above, in the delay measuring mode, the delay circuit 158 is used to delay the measurement start signal STR.

After the delay measuring mode has ended, the select signal SEL (or delay measuring mode signal MOD) goes to the high level, the multiplexor 159 selects the output signal from the second delay line 152. The selected signal is delayed by the delay circuit 158. At this time, the demultiplexor 160 outputs the delayed output signal from the delay circuit 158 as the signal FCL to the synchronous delay control circuit 120 (shown in FIG. 9).

As described above, after the delay measuring mode has ended, the delay circuit 158 is used to delay the output signal from the second delay line 152.

With the third embodiment, use of only a single delay circuit which occupies a relatively large region and therefore has a large circuit area makes the circuit area smaller than that in the second embodiment, even when the multiplexor 159 and demultiplexor 160 are newly added.

(Fourth Embodiment)

Figure 1:
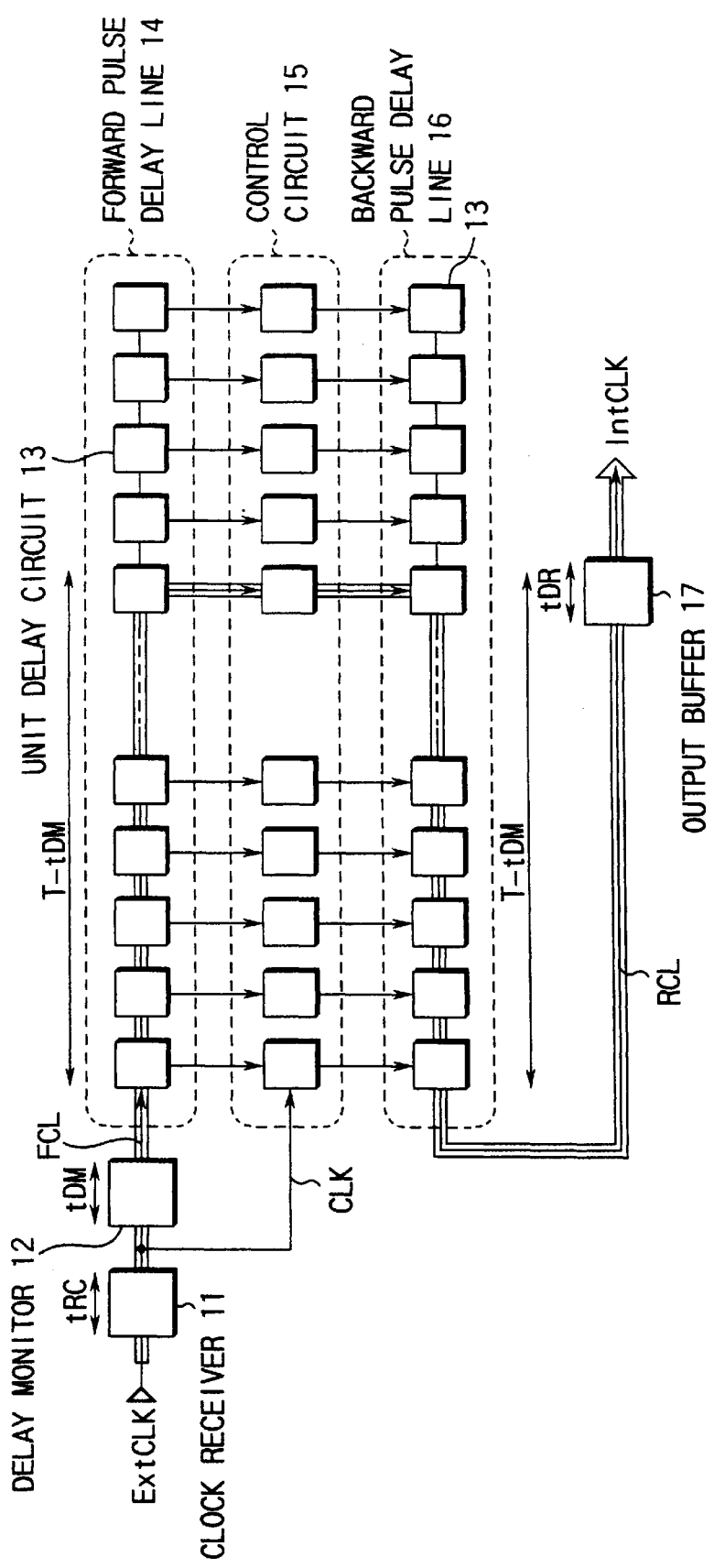
FIG. 1 is a block diagram of a conventional clocked delay control circuit of the SAD type.
Figure 2:
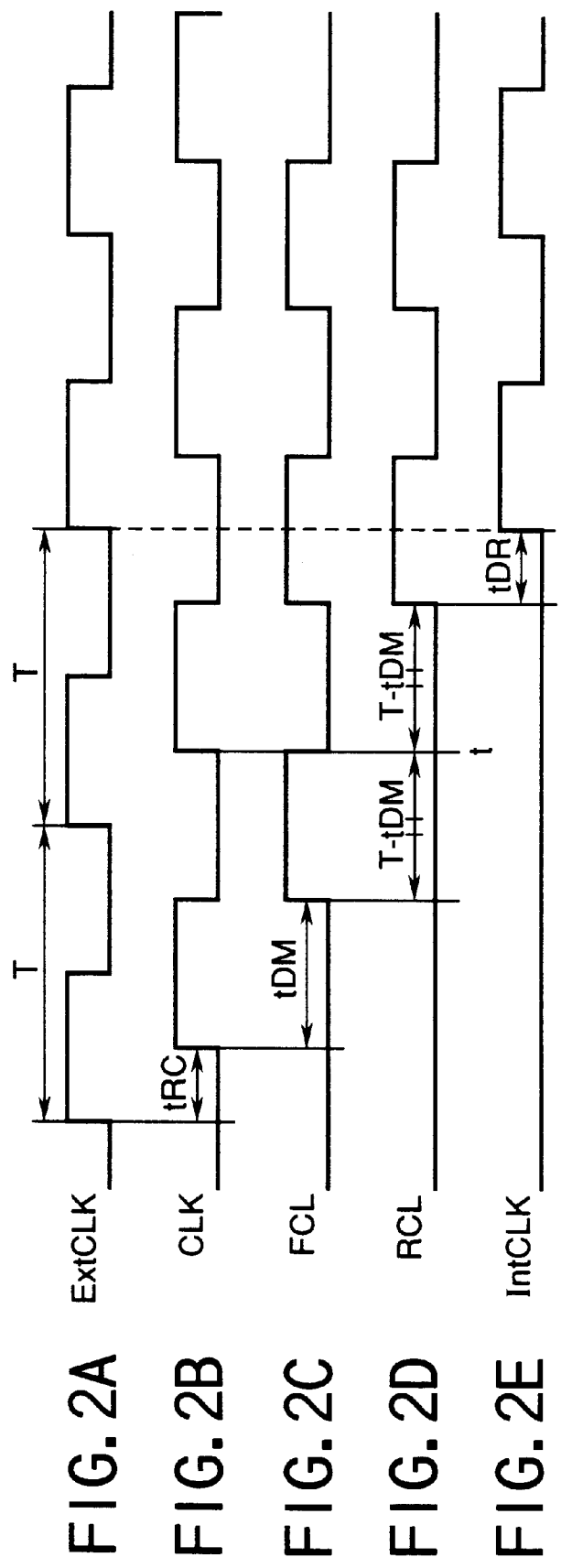
FIGS. 2A to 2E are timing charts to help explain the operation of the conventional clocked delay control circuit of FIG. 1.
Figure 3:
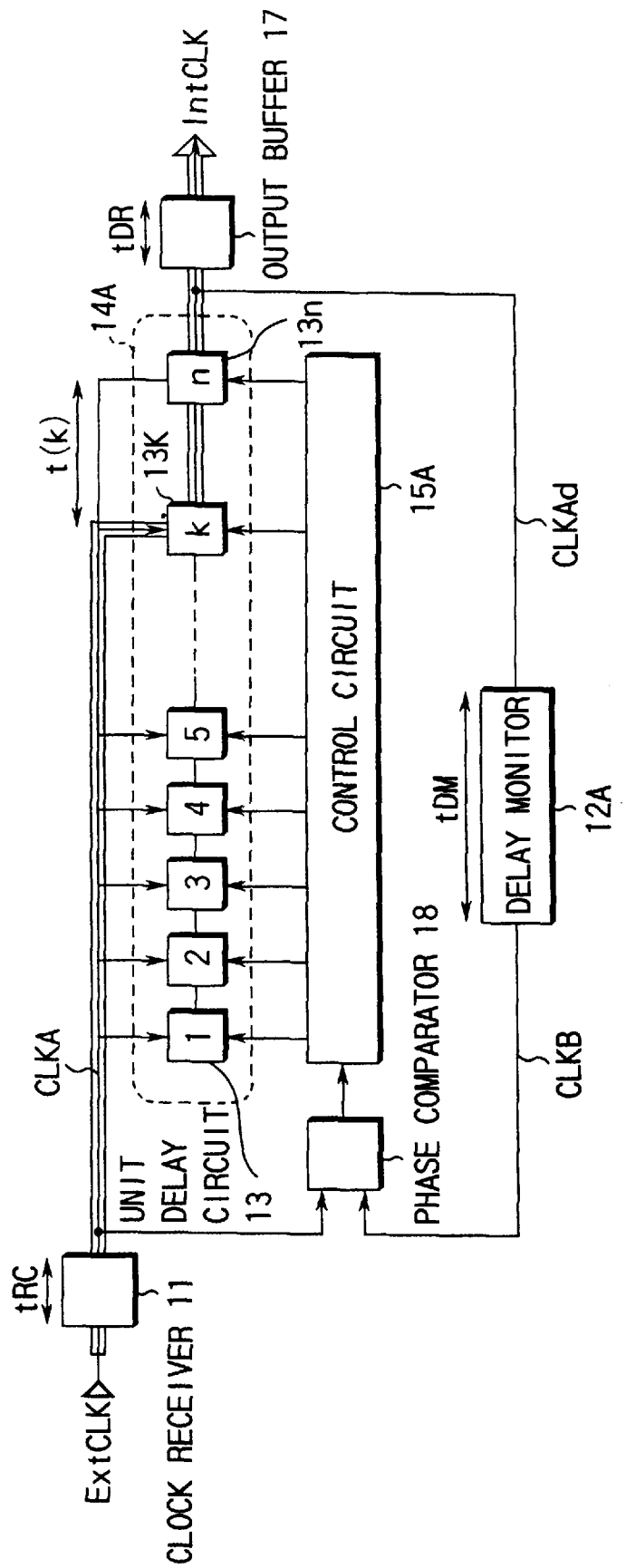
FIG. 3 is a block diagram of a conventional clocked delay control circuit of the DLL type.
Figure 4:
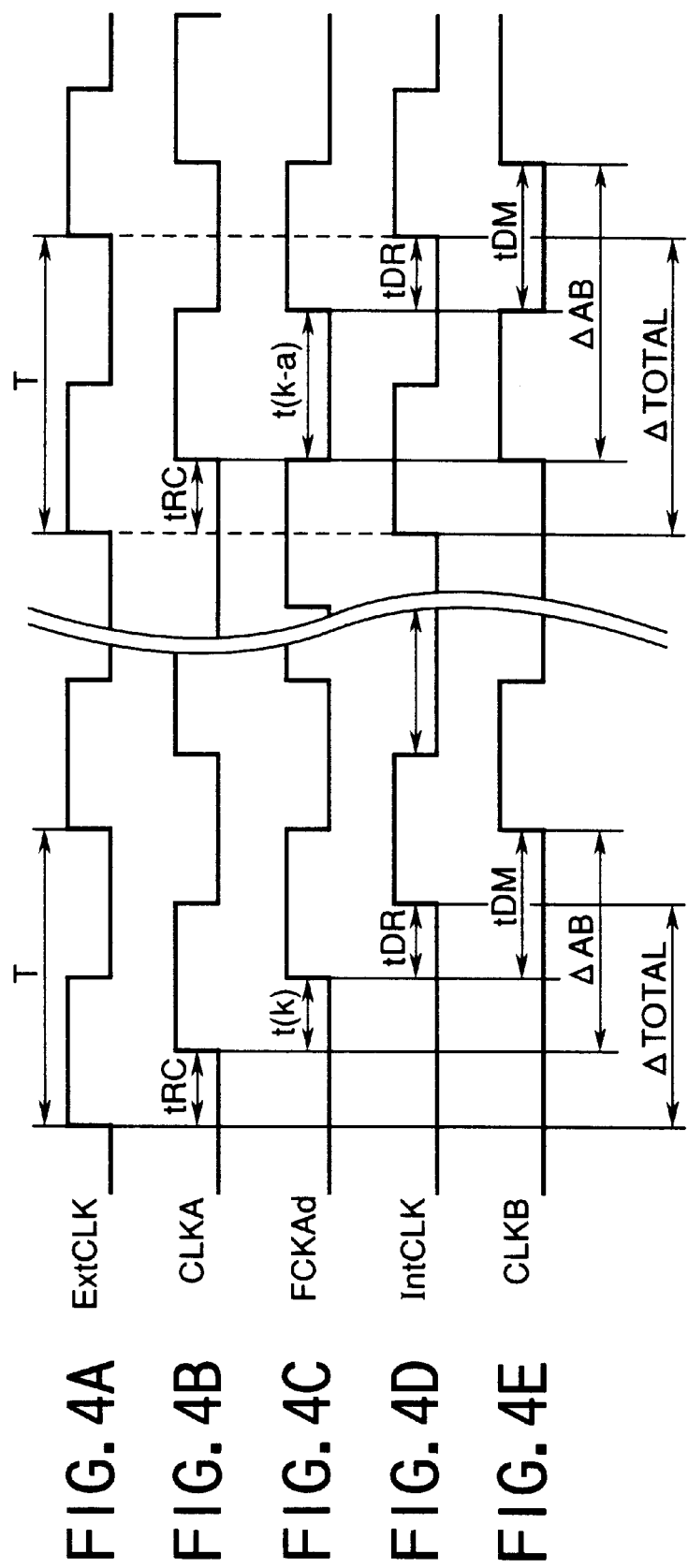
FIGS. 4A to 4E are timing charts to help explain the operation of the conventional clocked delay control circuit of FIG. 3.
Figure 5:
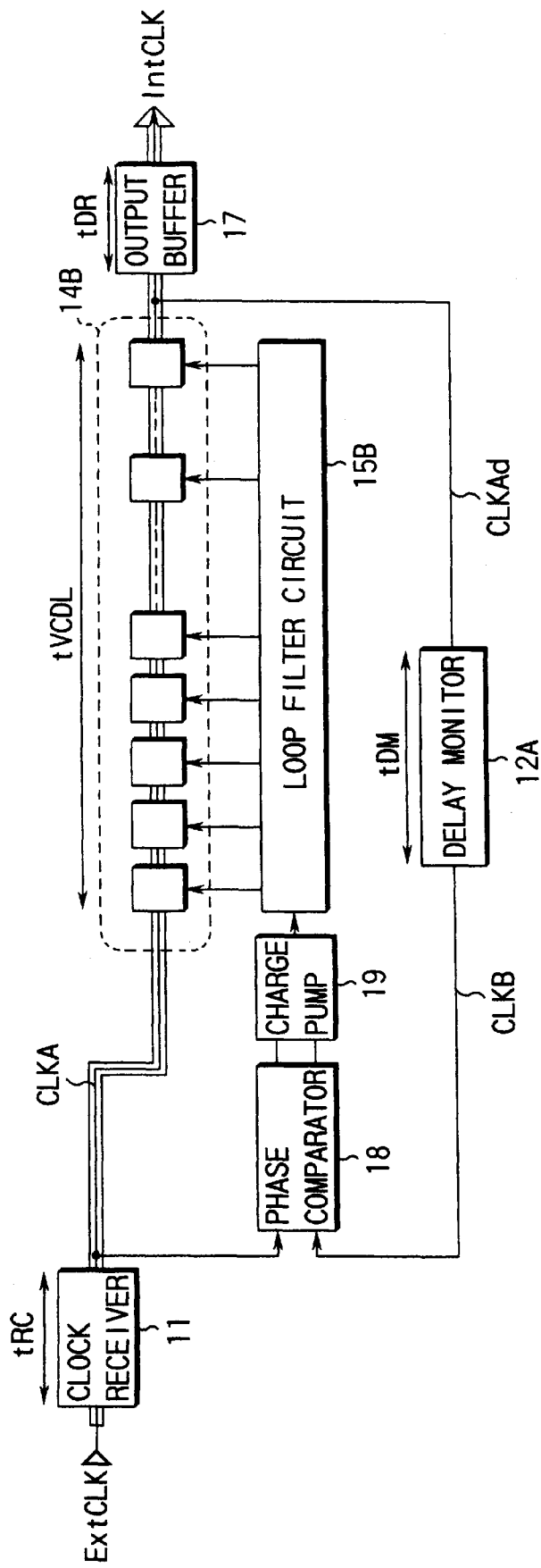
FIG. 5 is a block diagram of a conventional DLL clocked delay control circuit using an analog circuit.
Figure 6:
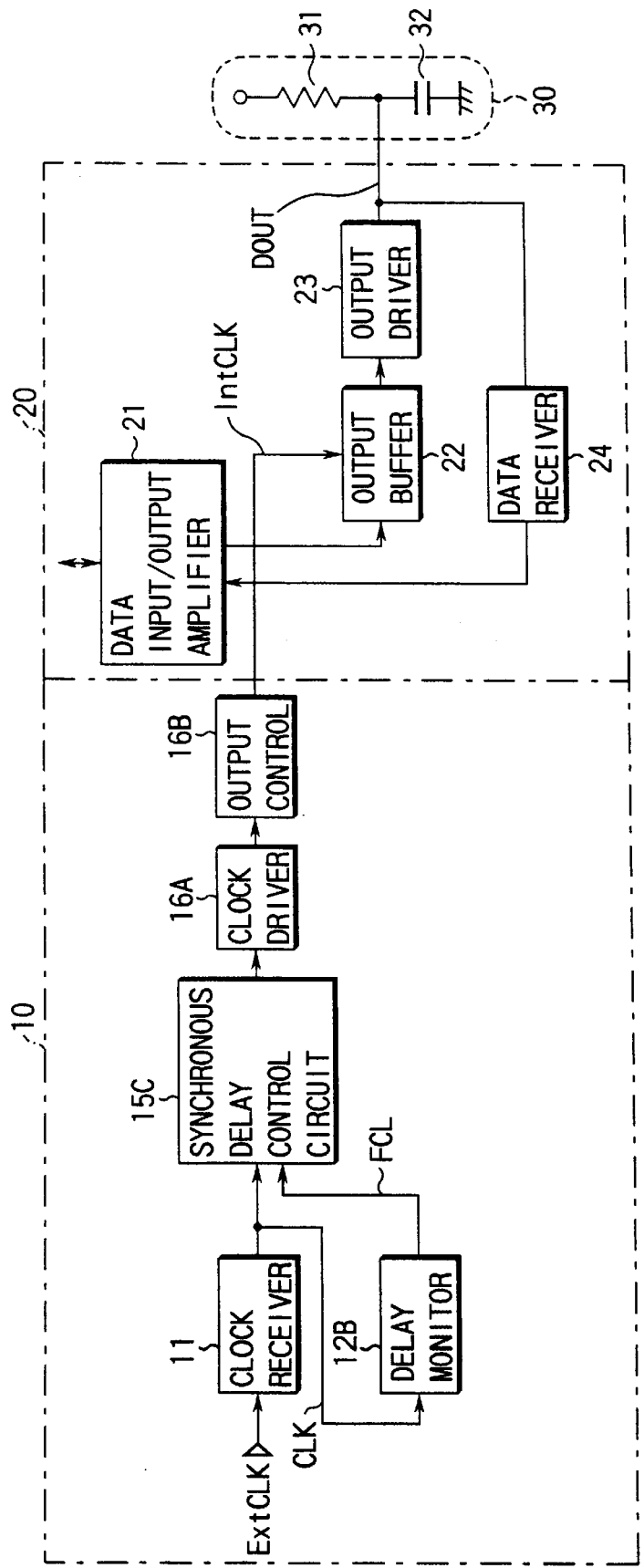
FIG. 6 is a block diagram of a conventional SAD clocked delay control circuit and a data input/output circuit for inputting and outputting data in synchronization with the internal clock signal generated at the clocked delay control circuit.
Figure 7:
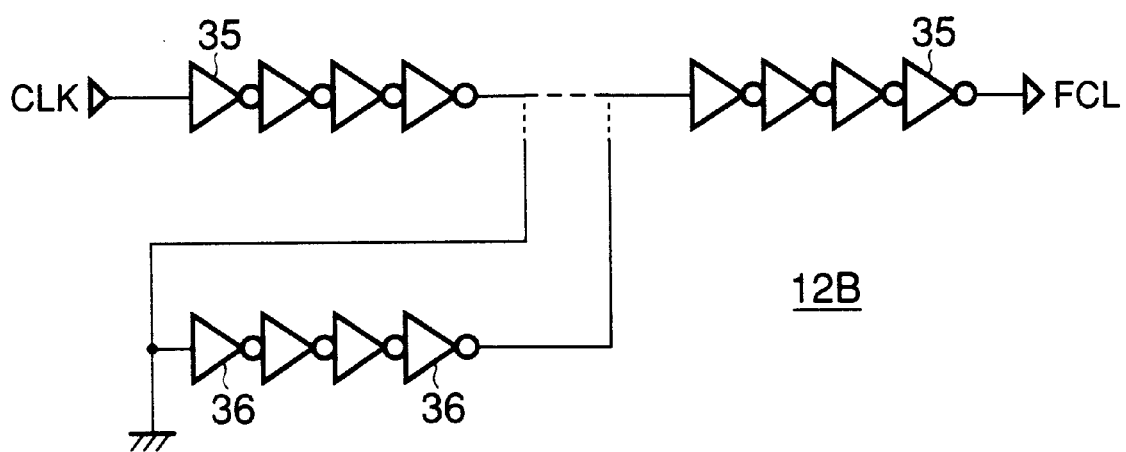
FIG. 7 is a circuit diagram of a conventional delay monitor used in the conventional clocked delay control circuit.
Figure 8:
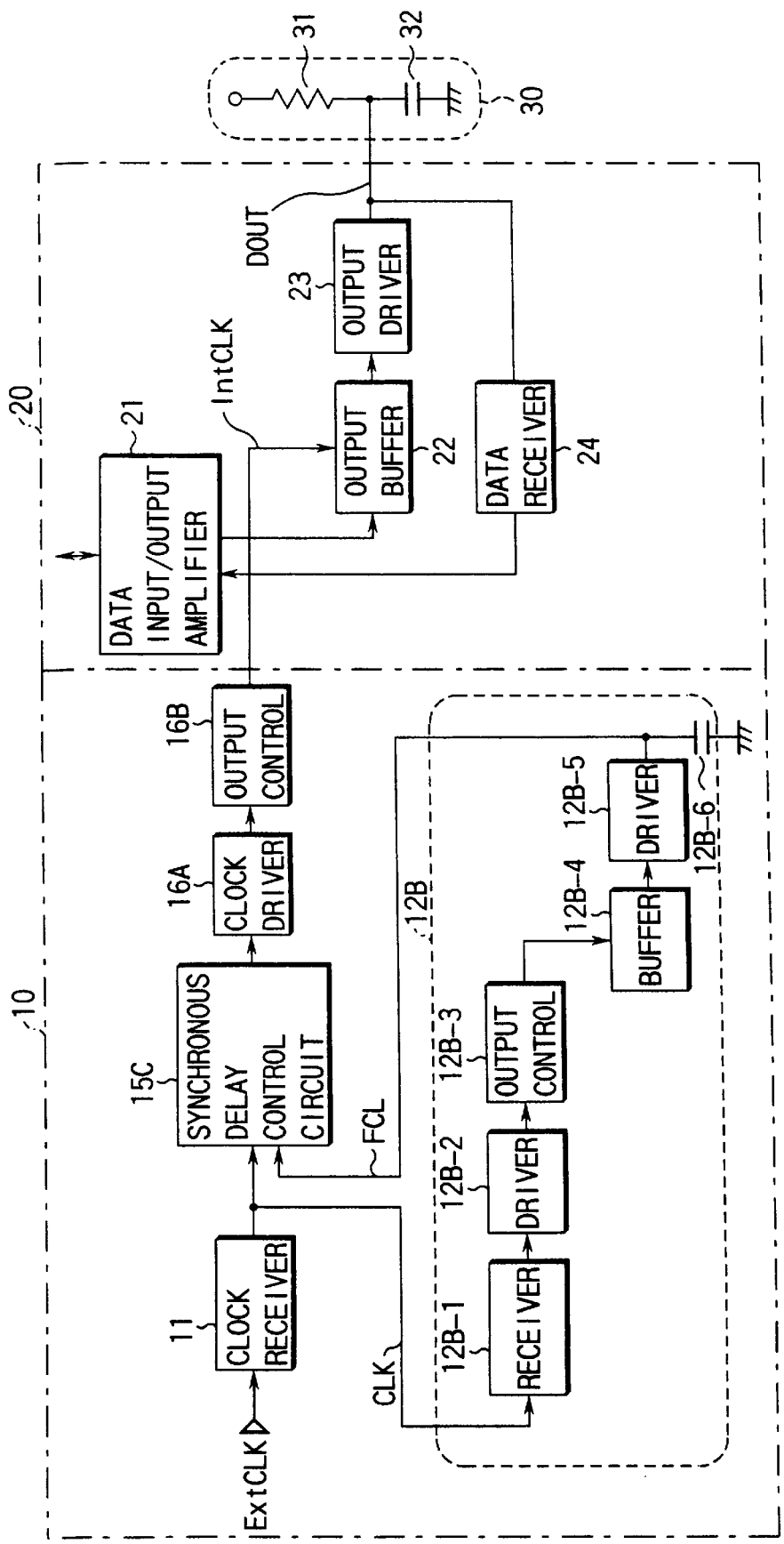
FIG. 8 is a block diagram of a conventional SAD clocked delay control circuit and a data input/output circuit for inputting and outputting data in synchronization with the internal clock signal generated at the clocked delay control circuit.

While in each of the above embodiments, the present invention has been applied to a clocked delay control circuit of the SAD type, it goes without saying that the invention may be applied to a clocked delay control circuit of the DLL type as shown in FIG. 3.

Figure 26:
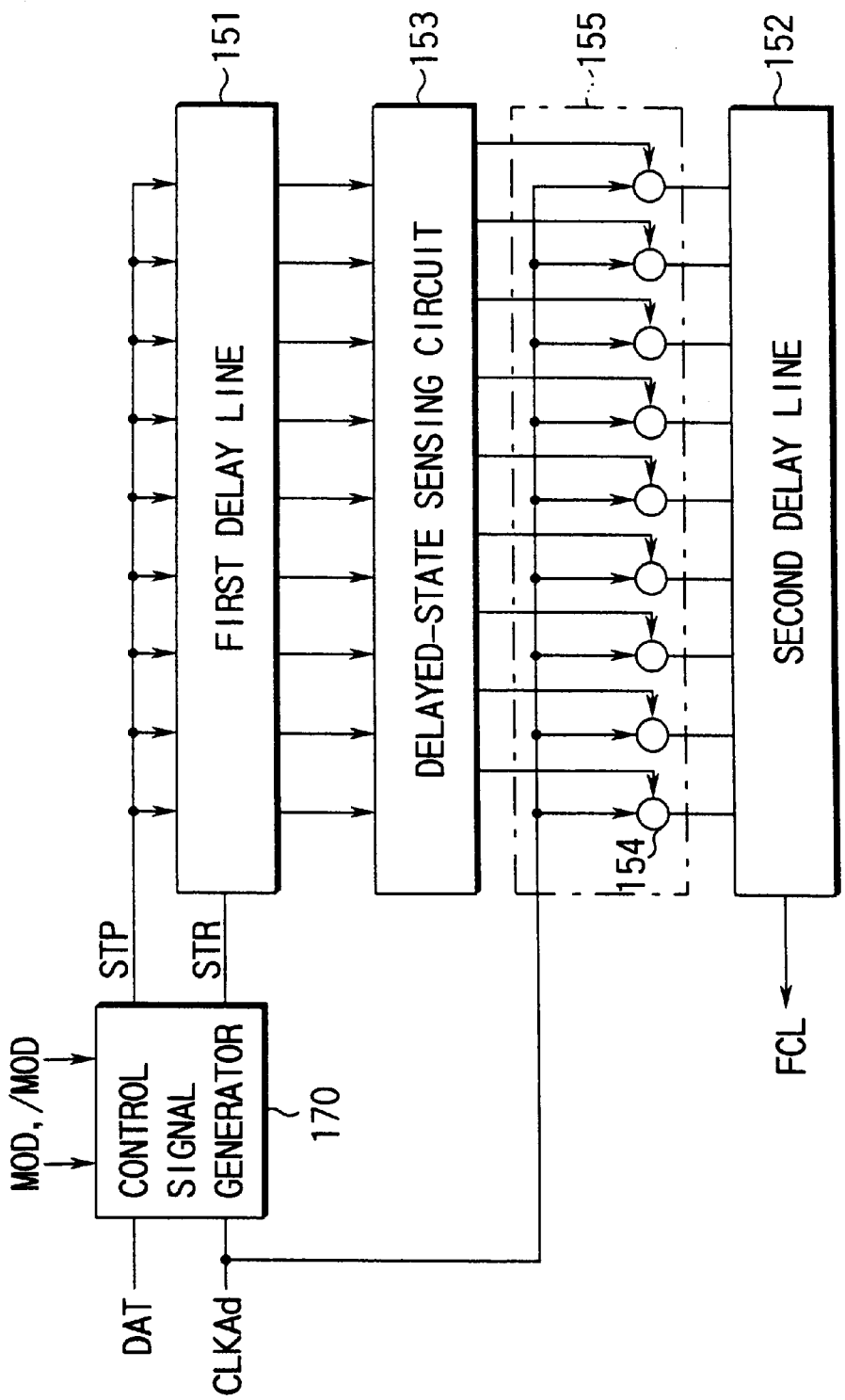
FIG. 26 is a block diagram showing an internal configuration of a delay monitor used in a semiconductor integrated circuit according to a fourth embodiment of the present invention.

FIG. 26 is a block diagram showing an internal configuration of a delay monitor used in a semiconductor integrated circuit according to a fourth embodiment of the present invention. In FIG. 26, the parts corresponding to those in the SAD clocked delay control circuit of FIG. 16 are indicated by the same reference symbols and explanation of them will be omitted. Only the parts differing from those in FIG. 16 will be explained.

In the delay monitor of FIG. 26, a control signal generator circuit 170 is provided in place of the control signal generator circuit 160 (shown in FIG. 9). The control signal generator circuit 170 generates the measurement start signal STR and measurement stop signal STP. Supplied to the control signal generator circuit 170 are not only the data signal DAT, delay measuring mode signal MOD, and its inverted signal /MOD but also the signal CLKAd outputted from the unit delay circuit 117 at the last stage of the conventional delay line 14A (shown in FIG. 3).

As described above, with the present invention, it is possible to provide a semiconductor integrated circuit which not only suppresses the increase of the circuit area as much as possible and prevents the drawn current from increasing but also generates an internal clock signal constantly synchronizing with an external clock signal exactly even when manufacturing process conditions, temperature, supply voltage, and the environment for the external data bus have changed, and therefore can always output the data synchronizing with the external clock signal with high accuracy.

What is claimed is:

1. A semiconductor integrated circuit comprising:
   an internal clock generator circuit which has a delay monitor for delaying an external clock signal and having a delay varying according to a delay control signal, and generates an internal clock signal synchronized with the external clock signal and a delay-measuring internal clock signal in a delay measuring mode;
   a data output circuit for outputting data onto an external data bus in synchronization with the internal clock signal generated at the internal clock generator circuit;
   a data input circuit for taking in the data outputted onto the external data bus; and
   a control signal generator circuit which generates a first control signal when the delay-measuring internal clock signal is generated by the internal clock generator circuit in the delay measuring mode and a second control signal when the data output circuit outputs the data onto the external data bus in synchronization with the generated internal clock signal, and then the data input circuit takes in the data and thereafter outputs the data, and which supplies the generated first and second control signals as the delay control signal to the delay monitor.

2. The semiconductor integrated circuit according to claim 1, wherein said delay monitor receives the output of the clock input circuit; and said internal clock generator circuit includes:
   a clock input circuit for receiving the external clock signal;
   a first delay line which includes first unit delay circuits connected in a multistage manner and propagates the output of the delay monitor as a forward pulse sequentially in such a manner that each of the first unit delay circuits delays the output for a specific time;
   a second delay line which includes second unit delay circuits connected in a multistage manner and propagates a backward pulse sequentially in such a manner that each of the second unit delay circuits delays the backward pulse for a specific time and which outputs the backward pulse to the second unit delay circuit from a last stage of the second delay line; and
   a delay line control circuit which stops the propagation of the forward pulse along the first delay line in response to the output of the clock input circuit and transfers the forward pulse propagated along the first delay line to the second delay line as the backward pulse.

3. The semiconductor integrated circuit according to claim 2, wherein said delay monitor includes:
   a third delay line which includes third unit delay circuits connected in a multistage manner and inputs its output signal to said first delay line;

a switch circuit group provided between the output of said clock input circuit and the third delay line;

a fourth delay line which includes fourth unit delay circuits connected in a multistage manner and which delays said first control signal generated by said control signal generator circuit in such a manner that the fourth unit delay circuits propagate said first control signal sequentially and stops the propagation of said first control signal when said second control signal generated by said control signal generator circuit is inputted; and a sensing circuit which senses the delayed state of said first control signal on the fourth delay line and, on the basis of the result of the sensing, selectively controls the switch circuit group in such a manner that the output of said clock input circuit is inputted to any of the third unit delay circuits provided in the third delay line.

4. The semiconductor integrated circuit according to claim 2, wherein said delay monitor includes:

a third delay line which includes third unit delay circuits connected in a multistage manner;

a first delay circuit which delays the output signal from the third delay line and inputs its delayed output signal to said first delay line;

a switch circuit group provided between the output of said clock input circuit and the third delay line;

a second delay circuit which has a delay practically equal to that of the first delay circuit and delays said first control signal generated at said control signal generator circuit;

a fourth delay line which includes fourth unit delay circuits connected in a multistage manner and which delays the output signal from the second delay circuit in such a manner that the fourth unit delay circuits propagate the output signal sequentially and stops the propagation of said output signal from the second delay circuit when said second control signal generated at said control signal generator circuit is inputted; and a sensing circuit which senses the delayed state of the output signal from the second delay circuit on the fourth delay line and, on the basis of the result of the sensing, selectively controls the switch circuit group in such a manner that the output from said clock input circuit is inputted to any of the third unit delay circuits provided in the third delay line.

5. The semiconductor integrated circuit according to claim 2, wherein said delay monitor includes;

a third delay line which includes third unit delay circuits connected in a multistage manner;

a switch circuit group provided between the output of said clock input circuit and the third delay line;

a fourth delay line which includes fourth unit delay circuits connected in a multistage manner and which delays the input signal in such a manner that the fourth unit delay circuits propagate the input signal sequentially and stops the delaying of the input signal when said second control signal generated at said control signal generator circuit is inputted;

a sensing circuit which senses the delayed state of the input signal on the fourth delay line and, on the basis of the result of the sensing, selectively controls the switch circuit group in such a manner that the output signal from said clock input circuit is inputted to any of the third unit delay circuits provided in the third delay line;

a delay circuit with a specific delay;

a first select circuit which, in the delay measuring mode, selects said second control signal generated at said control signal generator circuit and, in a mode other than the delay measuring mode, selects the delayed output signal from the third delay line and inputs the selected signal to the delay circuit; and a second select circuit which, in the delay measuring mode, supplies the delayed output signal from the delay circuit to the fourth delay line as an input signal and, in a mode other than the delay measuring mode, outputs the delayed output signal from the delay circuit to said first delay line.

6. The semiconductor integrated circuit according to claim 1, wherein said internal clock generator circuit includes:

a clock input circuit for receiving the external clock signal;

a delay line for delaying the output of the clock input circuit;

said delay monitor for receiving the output of the delay line;

a phase comparator for comparing the phase of the output of the clock input circuit with the phase of the output of the delay monitor; and a delay control circuit for controlling the delay operation of the delay line according to the output of the phase comparator.

7. A semiconductor integrated circuit comprising:

an internal clock generator circuit which includes a clock input circuit for receiving an external clock signal and a delay monitor for delaying the output from the clock input circuit and having a delay varying according to a delay control signal, and generates an internal clock signal synchronized with the external clock signal and a delay-measuring internal clock signal in a delay measuring mode;

a data output circuit for outputting data onto an external data bus in synchronization with the internal clock signal generated at the internal clock generator circuit;

a data input circuit which has a circuit configuration equivalent to that of the clock input circuit and takes in the data outputted onto the external data bus; and a control signal generator circuit which generates a first control signal when the delay-measuring internal clock signal is generated by the internal clock generator circuit in the delay measuring mode and a second control signal when the data output circuit outputs the data onto the external data bus in synchronization with the generated internal clock signal, and then the data input circuit takes in the data and thereafter outputs the data, and which supplies the generated first and second control signals as the delay control signal to the delay monitor.

8. The semiconductor integrated circuit according to claim 7, wherein each of said clock input circuit and data input circuit comprises a current-mirror load differential amplifier.

9. A semiconductor integrated circuit comprising:

an internal clock generator circuit which includes a circuit for generating a delay-measuring mode signal and a delay monitor for delaying an external clock signal and having a delay varying according to a delay control signal, and generates an internal clock signal synchronized with the external clock signal and a delay-measuring internal clock signal when said delay-measuring mode signal is generated;

a data output circuit for outputting data onto an external data bus in synchronization with the internal clock signal generated at the internal clock generator circuit;

a data input circuit for taking in the data outputted onto the external data bus; and a control signal generator circuit which generates a first control signal when the delay-measuring internal clock signal is generated by the internal clock generator circuit in a delay-measuring mode period set by said delay-measuring mode signal and a second control signal when the data output circuit outputs the data onto the external data bus in synchronization with the generated internal clock signal, and then the data input circuit takes in the data and thereafter outputs the data, and which supplies the generated first and second control signals as the delay control signal to the delay monitor.

10. The semiconductor integrated circuit according to claim 9, wherein said delay-measuring mode signal generator circuit includes a circuit for generating a pseudo internal clock signal by delaying, for a specific time, a chip initialize stop signal generated as a result of turning on the power supply to said semiconductor integrated circuit.

11. A semiconductor integrated circuit comprising:

an internal dock generator circuit which includes a delay monitor for delaying an external clock signal and having a delay varying according to a delay control signal, and a synchronous delay control circuit for generating an internal clock signal synchronized with the external clock signal and a delay-measuring pseudo internal clock signal in a delay measuring mode on the basis of the output of the delay monitor;

a data output circuit for outputting data onto an external data bus in synchronization with the internal clock signal generated at the internal clock generalor circuit;

a data input circuit for taking in the data outputted onto the external data bus; and a control signal generator circuit which generates a first control signal when the delay-measuring pseudo internal clock signal is generated by the internal clock generator circuit in the delay measuring mode period and a second control signal when the data output circuit outputs the data onto the external data bus in synchronization with the generated pseudo internal clock signal, and then the data input circuit takes in the data and thereafter outputs the data, and which supplies the generated first and second control signals as the delay control signal to the delay monitor.

12. The semiconductor integrated circuit according to claim 11, wherein said synchronous delay control circuit has a pseudo internal clock generator circuit which includes a circuit for generating a pseudo internal clock signal by delaying, for a specific time, a chip initialize stop signal generated as a result of turning on the power supply to said semiconductor integrated circuit.

13. A semiconductor integrated circuit comprising:

an internal clock signal generator circuit for generating an internal clock signal on the basis of an external clock signal; and a data input/output circuit for inputting and outputting data according to the internal clock signal, wherein said internal clock signal generator circuit includes
a clock receiver for receiving said external clock signal,
a delay monitor for generating delay information for adding a specific delay to the internal clock signal outputted from the clock receiver;
a synchronous delay control circuit for delaying said clock signal according to the delay information from said delay monitor and generating a pseudo internal clock signal in a delay measuring mode,
an internal clock signal output circuit for supplying the output of said synchronous delay control circuit to said data input/output circuit, and
a control signal generator circuit to which the pseudo internal clock signal from said synchronous delay control circuit and a detection signal obtained by detecting the input data inputted to said data input/output circuit are supplied, said control signal generator circuit includes a circuit for generating a measurement start signal in response to said pseudo internal clock signal and a measurement stop signal in response to said detection signal in said delay measuring mode, and said delay monitor includes a circuit for setting a delay in said internal clock signal on the basis of the timing with which said measurement start signal and measurement stop signal are supplied in said delay measuring mode and, after the completion of the delay measuring mode, delays the internal clock signal outputted from said clock receiver for the delay set in said delay measuring mode and thereafter outputs the delayed signal to the synchronous delay control circuit.

14. The semiconductor integrated circuit according to claim 13, wherein said synchronous delay control circuit includes a pseudo internal clock signal generator circuit for generating a pseudo internal clock signal by delaying, for a specific time, a chip initialize stop signal generated as a result of turning on the power supply to said semiconductor integrated circuit.

* * * * *

UNITED STATES PATENT AND TRADEMARK OFFICE
CERTIFICATE OF CORRECTION

PATENT NO.   : 6,313,676 B1  Page 1 of 1
DATED        : November 6, 2001
INVENTOR(S)  : Abe et al.

It is certified that error appears in the above-identified patent and that said Letters Patent is hereby corrected as shown below:

Column 25,
Line 27, change "dock" to -- clock --.
Line 38, change "generalor" to -- generator --.

Signed and Sealed this

Fourteenth Day of January, 2003

JAMES E. ROGAN
*Director of the United States Patent and Trademark Office*